United States Patent
Kawauchi et al.

(10) Patent No.: US 7,306,893 B2
(45) Date of Patent: *Dec. 11, 2007

(54) IMAGE RECORDING MATERIAL AND PLANOGRAPHIC PRINTING PLATE

(75) Inventors: Ikuo Kawauchi, Shizuoka-ken (JP); Miki Takahashi, Shizuoka-ken (JP); Masako Imai, Shizuoka-ken (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/928,170

(22) Filed: Aug. 30, 2004

(65) Prior Publication Data

US 2005/0048399 A1 Mar. 3, 2005

(30) Foreign Application Priority Data

Aug. 29, 2003 (JP) ............................. 2003-306918
Apr. 15, 2004 (JP) ............................. 2004-120695

(51) Int. Cl.
*G03F 7/039* (2006.01)
*G03F 7/11* (2006.01)
*G03F 7/14* (2006.01)

(52) U.S. Cl. .................. 430/276.1; 430/302; 430/964; 430/278.1

(58) Field of Classification Search ............. 430/270.1, 430/271.1, 281.1, 302, 964, 276.1, 278.1
See application file for complete search history.

(56) References Cited

U.S. PATENT DOCUMENTS

| | | | |
|---|---|---|---|
| 6,114,089 A * | 9/2000 | Takita et al. ............. | 430/278.1 |
| 6,143,464 A | 11/2000 | Kawauchi | |
| 6,440,633 B1 | 8/2002 | Kawauchi | |
| 6,830,874 B2 * | 12/2004 | Kondo et al. ............... | 430/302 |
| 6,884,565 B2 * | 4/2005 | Takahashi et al. ....... | 430/270.1 |
| 2004/0185375 A1 * | 9/2004 | Takahashi et al. .......... | 430/300 |
| 2005/0058936 A1 * | 3/2005 | Kawauchi et al. ....... | 430/270.1 |

FOREIGN PATENT DOCUMENTS

| | | |
|---|---|---|
| EP | 0 823 327 A2 | 2/1998 |
| EP | 0 992 850 A2 * | 10/1999 |
| EP | 0 965 887 A1 | 12/1999 |
| EP | 1 396 756 A2 | 3/2004 |
| JP | 10-69092 | 3/1998 |
| JP | 10-268512 A | 10/1998 |
| JP | 11-038635 * | 2/1999 |
| JP | 11-44956 A | 2/1999 |
| JP | 2000-108538 A | 4/2000 |

OTHER PUBLICATIONS

Communication from European Patent Office dated Dec. 08, 2005.

* cited by examiner

*Primary Examiner*—Richard L. Schilling
(74) *Attorney, Agent, or Firm*—Sughrue Mion, PLLC

(57) ABSTRACT

An image recording material of the present invention comprises an anodized aluminum support, an intermediate layer containing a polymer having a carboxylic acid group in a side chain thereof and formed on the aluminum support, and a photosensitive layer containing at least 50% by weight or more of novolak type phenol resin and a photothermal conversion agent and recordable by IR laser beam. A planographic printing plate excellent in printing durability can be obtained by subjecting the image recording material imagewise to IR laser exposure treatment and to development treatment, and then heating the image recording material at 150 to 300° C.

16 Claims, No Drawings

IMAGE RECORDING MATERIAL AND PLANOGRAPHIC PRINTING PLATE

CROSS-REFERENCE TO RELATED APPLICATION

This application claims priority under 35 USC 119 from Japanese Patent Application Nos. 2003-306918 and 2004-120695, the disclosures of which are incorporated by reference herein.

BACKGROUND OF THE INVENTION

1. Field of the Invention

The present invention relates to a positive type photosensitive composition, the solubility of which, in an aqueous alkaline solution, is enhanced by being exposed to infrared rays. More specifically, the invention relates to a positive type photosensitive composition useful as a recording layer of a planographic printing plate precursor that can be subjected to the so-called direct plate-making method, according to which a printing plate can be directly made up by scanning of an infrared laser on the basis of digital signals received from a computer or the like.

2. Description of the Related Art

Hitherto, various photosensitive compositions have been used for the formation of visible images, or as a material for planographic printing plate precursors. Recently, remarkable developments have taken place in the area of lasers for planographic printing. With particular, regard to both solid lasers and semiconductor lasers having an emission wavelength within a near infrared or infrared wavelength range, it has become easy to obtain lasers which have a high level of output and which are at the same time compact. These lasers are extremely useful as light sources for exposure when printing plates are made up directly on the basis of digital data received from a computer or the like.

Materials which can be used for positive type planographic printing plate precursors applicable for infrared lasers include, as essential components, a binder resin soluble in an aqueous alkaline solution (hereinafter referred to where appropriate as an "alkali-soluble resin"), and an infra red dye which absorbs light to generate heat. When an image is formed in a positive type planographic printing plate precursor, the infra red dye interacts with the binder resin in its unexposed portions (image portions) so as to function as a dissolution inhibitor which can substantially reduce the solubility of the binder resin. On the other hand, in its exposed portions (non-image portions), interaction of the infra red dye with the binder resin is weakened by the heat generated. Consequently, an exposed portion can turn into a state in which it can be dissolved in an alkaline developer, so that an image is formed thereon.

However, insofar as infrared-laser-applicable positive planographic printing plate precursor materials are concerned, differences in the degree of resistance against dissolution in a developer between unexposed portions (image portions) and exposed portions (non-image portions) therein, that is, differences in development latitude have not yet been sufficient under various conditions of use. Thus, problems have occurred insofar that, with changes in conditions of use of materials, materials have tended to be either excessively developed or inadequately developed.

Further, in the image-forming portion, the IR dye or the like only serves as a dissolution inhibitor to the un-exposed portion (the image-forming portion) and the strength of the image-forming portion is not particularly improved by the IR dye in the image formation mechanism. Therefore, attempts are being made to select suitable polymers in order to obtain sufficient strength of the image-forming portion. For example, a technique to use novolak resin as a main binder has been proposed (refer to, for example, Japanese Patent Application Laid-Open (JP-A) No. 10-268512), whereby the printing durability is improved by carrying out burning treatment. However, the recording layer has another problem in that it is inferior in chemical resistance.

On the other hand, from the viewpoint of improving the chemical resistance of the recording layer, an image recording material using a sulfonamide based copolymer having a specific structure as a binder polymer has been proposed (e.g., JP-A No. 11-44956). For this type of polymer, although printing durability is observed if a cleaner is used, the printing durability cannot be improved by burning treatment. If the burning treatment is not carried out (even if the composition of the binder polymer is changed), the printing durability will be insufficient and therefore, adequacy in both chemical resistance and printing durability cannot be obtained at the same time.

Accordingly, attempts are being made to improve the printing durability by forming a predetermined intermediate layer between a support and a recording layer. There is disclosed a case in which an intermediate layer containing a copolymer of a carboxylic acid group-containing monomer and an onium salt-containing monomer is provided on a support which has been subjected to hydrophilization with a silicate (e.g., JP-A No. 2000-108538). According to this method, although printing durability and staining resistance of the non-image-forming portion are improved, chemical resistance is still insufficient. Therefore, there has been a strong desire for an image recording material having excellent chemical resistance and also having printing durability considerably improved by the burning treatment. Hereinafter, the excellent printing durability obtained by the burning treatment may be referred to as "printing durability by burning" in some cases.

SUMMARY OF THE INVENTION

In consideration of the disadvantages of the above-mentioned prior arts, the present invention provides an IR laser image recording material having excellent printing durability of an image-forming portion, remarkably improved printing durability by burning, and excellent chemical resistance.

On the basis of the results of investigations, the inventors have found that use of a polymer compound having a specific reactive group in a side chain thereof can solve the above-mentioned problems, and accordingly have completed the present invention.

That is, an image recording material of the invention comprises: an anodized aluminum support; an intermediate layer containing a polymer having a carboxylic acid group in a side chain thereof; a photosensitive layer containing 50% by weight or more of novolak type phenol resin and a photothermal conversion agent and recordable by IR laser beam, the intermediate layer and the photosensitive layer being successively formed on the anodized aluminum support.

A planographic printing plate, obtained by: preparing an image recording material comprising an anodized aluminum support, and at least an intermediate layer and a photosensitive layer successively formed on the aluminum support; subjecting the image recording material to IR laser exposure treatment and to development treatment and; heating the image recording material at 150 to 300° C., wherein the intermediate layer contains a polymer having a carboxylic acid group (which polymer will occasionally be referred to as "a specific polymer" hereinafter) in a side chain thereof, and the photosensitive layer contains at least 50% by weight or more of novolak type phenol resin and a photothermal conversion agent and is recordable by IR laser beam.

In the present specification, the term successively formed means the intermediate layer and the photosensitive layer are formed in this order on the support and does not exclude the existence of other layers (e.g. a protection layer, a back coat layer and the like) to be formed according to the purposes.

With regard to an effect of the present invention, it is assumed that the polymer having a carboxylic acid group in a side chain, to be contained in the intermediate layer of the invention, causes firm interaction with an anodized coating existing on the support surface owing to the function of the carboxylic acid, so that the adhesion strength between the support and the photosensitive layer can be improved, thereby improving the chemical resistance.

Moreover, the photosensitive layer is presumed to receive sufficient heat energy also from the aluminum support side by being heated to 150 to 300° C. at the time of burning treatment and thus forms the thermal cross-linking structure owing to the function of the novolak resin, which is the main component of the photosensitive layer. In such a manner, the photosensitive layer shows excellent burning printing durability, wherein printing durability improves significantly.

In general, in an IR laser-sensitive positive type photosensitive layer, there is a possibility that the reaction does not sufficiently proceed to the vicinity of the support surface due to heat diffusion to the support during exposure, thereby resulting in unsatisfactory removal of the photosensitive layer in the non-image-forming portion. However, since the specific polymer composing the intermediate layer comprises the carboxylic group in the side chain, solubility in a developer is good and accordingly, occurrence of stains in the non-image-forming portion is believed to be suppressed.

Accordingly, the invention provides an IR laser-use positive type image recording material displaying excellent printing durability in the image-forming portion, remarkable improvement in printing durability by burning treatment, and also excellent chemical resistance. The invention also provides a planographic printing plate excellent in printing durability and chemical resistance by using the image recording material.

DETAILED DESCRIPTION OF THE INVENTION

An image recording material of the present invention comprises an anodized aluminum support, an intermediate layer containing a polymer having a carboxylic acid group in a side chain thereof, a photosensitive layer containing novolak type phenol resin and a photothermal conversion agent and recordable by IR laser beam, the intermediate layer and the photosensitive layer being successively formed on the anodized aluminum support.

[Intermediate Layer]

At first, the intermediate layer which constitutes the characteristic structure of the invention will be described.

The intermediate layer to be formed between the support and the photosensitive layer comprises a polymer having a carboxylic acid group in a side chain thereof. The polymer to be used here is not particularly limited as long as the polymer comprises a carboxylic acid group in a side chain thereof, and the polymer may be either those obtained by polymerization of the monomer comprising the carboxylic acid group in the side chain or those obtained by introducing a predetermined amount of the carboxylic group to the side chain of the polymer. Incidentally, the carboxylic acid group of the present invention may include those in form of alkali metal salts or ammonium salts.

Examples of the polymers for the intermediate layer of the invention include vinyl based polymers whose main chain structure is, for example, acrylic resin, methacrylic resin, or polystyrene. Specific examples thereof include polymer containing, as a polymer component, a monomer which has carboxylic acid group in the side chain thereof and defined by the following general formula (1) or general formula (2):

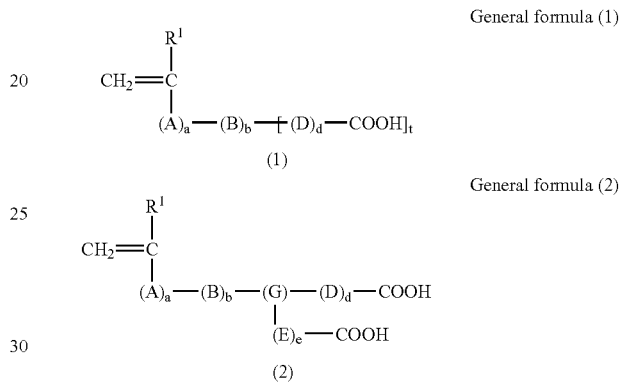

wherein A represents a divalent linking group; B represents an aromatic group or a substituted aromatic group; D and E independently represent divalent linking groups; G represents a trivalent linking group; the carboxylic acid group expressed as —COOH may form an alkali metal salt or ammonium salt; $R^1$ represents a hydrogen atom, an alkyl or a halogen atom; a, b, d, and e independently represent 0 or 1; and t represents an integer of 1 to 3.

Among these monomers, more preferably A is —COO— or —CONH— and B is a phenylene group or a substituted phenylene group, and examples of an introducible substituent group include a hydroxyl group, a halogen atom or an alkyl group. Preferable examples of the substituent group include a hydroxyl group or an alkyl group having 1 to 3 carbon atoms. D and E independently represent an alkylene group or a divalent linking group defined as $C_nH_{2n}O$, $C_nH_{2n}S$, or $C_nH_{2n+1}N$, and preferably an alkylene group having 1 or 2 carbon atoms or an alkylene group having 1 or 2 carbons bonded with an oxygen atom. G represents a trivalent linking group defined by the following molecular formula $C_nH_{2n-1}$, $C_nH_{2n-1}O$, $C_nH_{2n-1}S$, or $C_nH_{2n}N$ wherein n represents an integer of 1 to 12. $R^1$ represents a hydrogen atom or an alkyl group. The reference characters, a, b, d, and e, independently represent 0 or 1, and a and b cannot be zero simultaneously. Preferably, a is zero and b is 1.

Specific examples of the monomers having carboxylic groups are as follows. However, the monomers of the invention are not limited to these specific examples.

(Specific Examples of Monomers Having Carboxylic Acid Groups)

Examples thereof include acrylic acid, methacrylic acid, crotonic acid, isocrotonic acid, itaconic acid, maleic acid, maleic anhydride and the following monomers.

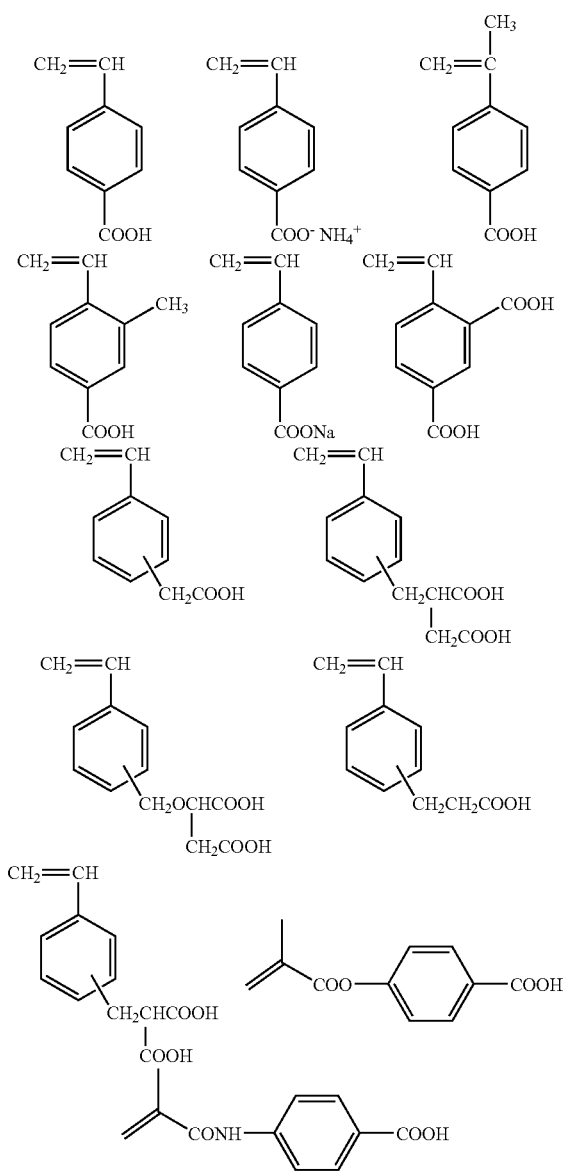

Further, other specific and preferable examples include monomers having side chain structure defined by the following general formula (I) described in Japanese Patent Application No. 2003-78699 filed by the inventors of the present invention.

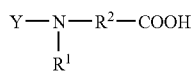

General formula (1)

In the general formula (I), Y represents a linking group to a polymer main chain skeleton; $R^1$ represents a hydrogen atom or a hydrocarbon group; and $R^2$ represents a divalent hydrocarbon group.

In the general formula (I), examples of the linking group represented by Y include substituted or unsubstituted divalent hydrocarbon groups. The hydrocarbon groups may have one or more partial structures containing one or more hetero atoms selected from an oxygen atom, a nitrogen atom, and a sulfur atom.

In the general formula (I), $R^1$ represents a hydrogen atom or a hydrocarbon group.

As the hydrocarbon group represented by $R^1$, hydrocarbon groups having 1 to 30 carbon atoms are preferable. Among these hydrocarbon groups, an alkyl group or an aryl group is further preferable.

The hydrocarbon groups represented by $R^1$ may further have substituent groups, which will be described later. Preferable examples of the substituent group include a carboxyl group and a conjugated basic group thereof.

The most preferable form of the hydrocarbon groups represented by $R^1$ is alkyl or aryl group having a carboxyl group or a conjugated basic group.

The hydrocarbon groups and the substituent groups introducible into the hydrocarbon groups for $R^1$ will be described.

Specific examples of the allyl groups represented by $R^1$ include straight chain, branched, or cyclic alkyl groups having 1 to 30 carbon atoms such as methyl, ethyl, propyl, butyl, pentyl, hexyl, heptyl, octyl, nonyl, decyl, undecyl, dodecyl, tridecyl, hexadecyl, octadecyl, eicocyl, isopropyl, isobutyl, sec-butyl, tert-butyl, isopentyl, neopentyl, 1-methylbutyl, isohexyl, 2-ethylhexyl, 2-methylhexyl, cyclopentyl, cyclohexyl, 1-adamantyl, and 2-norbonyl.

Examples of the aryl groups represented by $R^1$ include condensed rings formed by condensing 2 to 4 benzene rings and condensed rings of benzene rings and unsaturated five-member rings.

Specific examples of the aryl groups represented by $R^1$ are aryl groups having 6 to 30 carbon atoms such as phenyl, naphthyl, anthryl, phenanthryl, indenyl, acetonaphthenyl, fluorenyl, and pyrenyl.

The hydrocarbon groups represented by $R^1$ may be substituted with optional substituent groups at one or more sites. Examples of the substituent group introducible into $R^1$ include monovalent non-metallic atom group other than a hydrogen atom. As the substituent groups introducible into $R^1$, carboxyl and a conjugated basic group thereof is preferable. An alkoxycarbonyl group and an aryloxycarbonyl group are more preferable. Carboxyl and a conjugated basic group thereof are particularly preferable.

$R^2$ in the general formula (I) represents divalent hydrocarbon groups which may further comprise substituent groups. The hydrocarbon groups may contain one or more hetero atoms selected from an oxygen atom, a nitrogen atom, and a sulfur atom.

Examples of As the substituent groups introducible into $R^2$ include those exemplified as the substituent groups introducible into $R^1$. Examples of the preferable substituent group are also the same as those described with respect to $R^1$.

As the divalent hydrocarbon groups represented by $R^2$, alkylene groups which may comprise substituent groups are preferable. Specific examples of the alkylene groups include straight chain or branched chain alkylene groups such as methylene, ethylene, propylene, butylene, isopropylene, and isobutylene. Preferable examples thereof include the above-mentioned alkylene groups having carboxylic acid groups as substituents.

The carboxylic acid groups included in the general formula (I) may be in form of alkali metal salts or ammonium salts.

More preferable structure of the general formula (I) is one in which $R^1$ represents a carboxylic acid group-substituted hydrocarbon group and R² represents an alkylene group substituted with a straight chain alkylene or carboxylic acid group. Furthermore preferable structure of the general formula (I) is one in which R¹ represents a carboxylic acid group-substituted alkyl group and R² represents a straight chain alkylene group.

As a method for introducing the structure defined by the general formula (I) into a polymer as a side chain, monomers having the structure defined by the general formula (I) may be polymerized or copolymerized by a known method. As other methods, there are a method of causing reaction of poly-p-aminostyrene and acetic acid chloride and a method of causing reaction of polychloromethylstyrene and iminodiacetonitrile and then hydrolyzing the obtained product. In terms of easiness in control of the introduction ratio of the structure defined by the general formula (I), the method of polymerizing or copolymerizing the monomers having the structure defined by the general formula (I) by a known method is preferable.

In the case where the specific polymer is a copolymer, it may be a random copolymer, a block copolymer or a graft copolymer.

The synthesis of the specific polymer can be carried out by radical polymerization using a polymerization initiator such as peroxides such as di-tert-butyl peroxide and benzoyl peroxide; persulfates such as ammonium persulfate; and azo compounds such as azobisisobutylonitrile. The polymerization initiator may appropriately be selected depending on the polymerization manner to be employed. As the polymerization manner, solution polymerization, emulsification polymerization, or suspension polymerization can be applied.

As a polymerization solvent to be used at the time of synthesis, examples thereof include acetone, methyl ethyl ketone, methanol, ethanol, propanol, ethylene glycol monomethyl ether, ethylene glycol monomethyl ether, diethylene glycol dimethyl ether, 1-methoxy-2-propanol, 2-methoxyethyl acetate, 1-methoxy-2-propylacetate, dimethoxyethane, methyl lactate, ethyl lactate, ethyl acetate, N,N-dimethylacetamide, N,N-dimethylformamide, dimethyl sulfoxide, tetrahydrofuran, toluene, and water, but the solvent is not limited to these examples.

Further, the monomers having the structure defied by the general formula (I) are preferably those comprising the following structures.

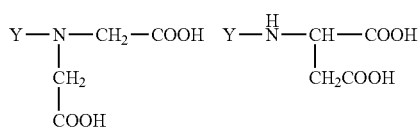

Preferable structures of the linking group of the polymer main chain skeleton defined by Y are the following structures.

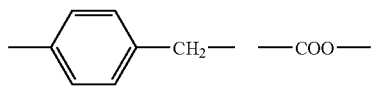

Specific examples of the monomers having the structure defined by the general formula (I) include the following compounds, but the monomers in the invention are not limited to these examples.

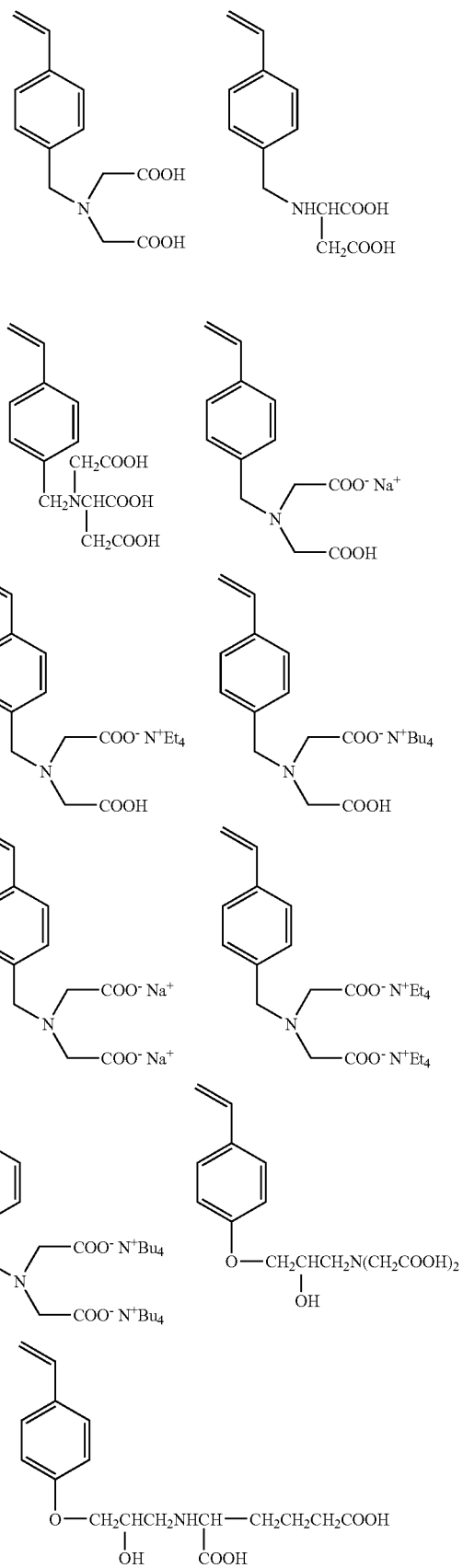

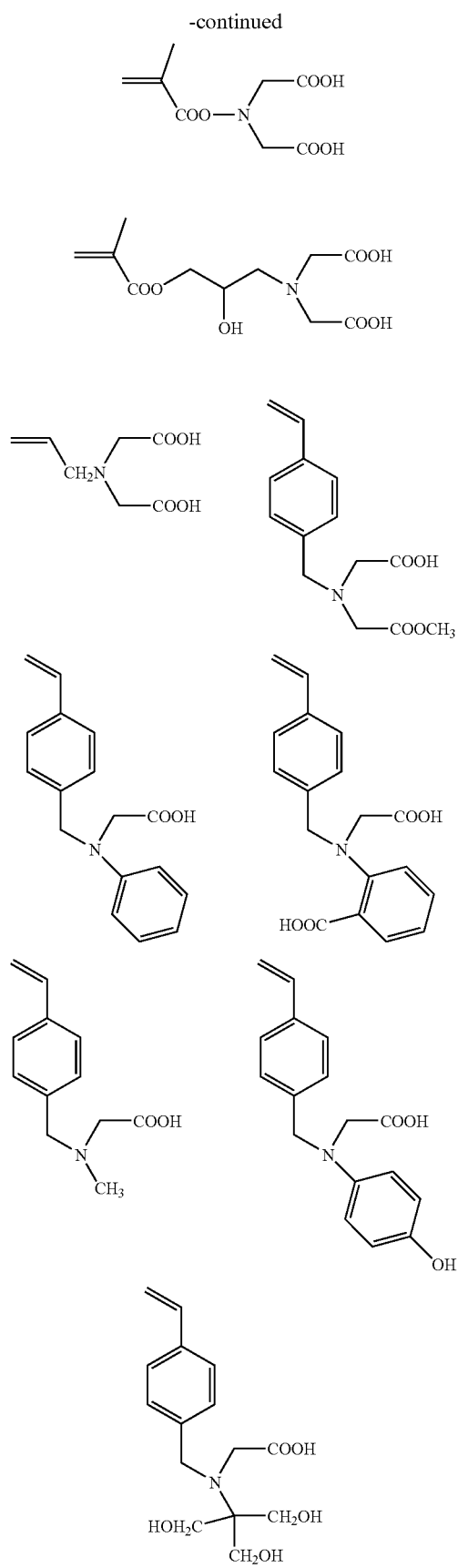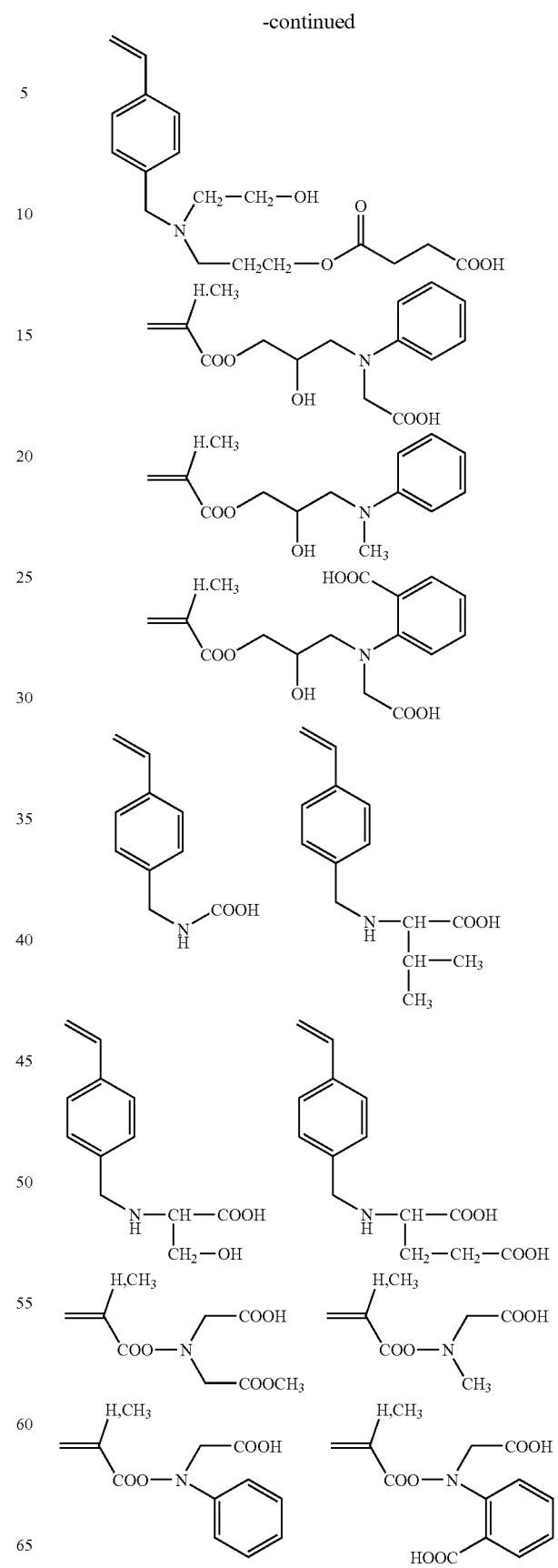

-continued

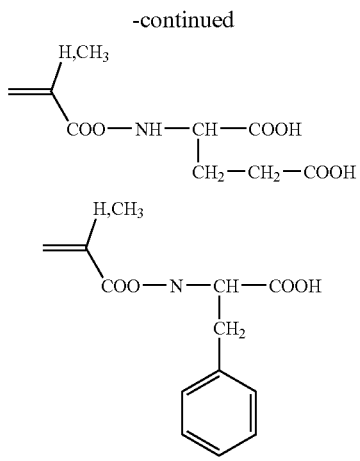

As the monomer having the carboxylic acid group in the polymer having a carboxylic acid group in the side chain thereof according to the invention, polyvalent carboxylic acid monomers are preferable. The content of the monomer having the carboxylic acid group is preferably 5% by mole or more and more preferably in a range of 20 to 100% by mole, in terms of achieving sufficient improvement of the printing durability due to interaction with an aluminum support.

The weight average molecular weight of the specific polymer of the invention is preferably 500 to 1,000,000 and more preferably 1,000 to 500,000.

(Other Monomer Components)

The specific polymer of the invention may be copolymerized with other monomer components for the purpose of strengthening the interaction with the support or the interaction with the photosensitive layer. Examples of other monomer components include "monomer containing an onium group" in terms of improving adhesion to the hydrophilized substrate and "monomer containing a lactone group" in terms of improving chemical resistance and solubility in a developer solution.

As the monomers containing an onium group, monomers defined by the following general formulas (3) to (5) can be exemplified, but they are not limited to these examples.

General formulas (3)

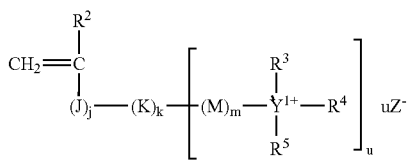

General formulas (4)

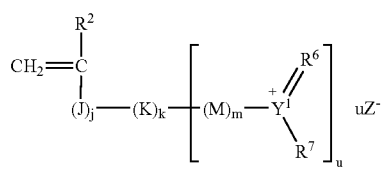

General formulas (5)

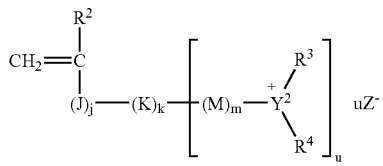

In the general formulas (3) to (5), J represents a divalent linking group; K represents an aromatic group or a substituted aromatic group; M represents a divalent linking group; $Y^1$ represents an atom belonging to V group in a periodic table; $Y^2$ represents an atom belonging to VI group in a periodic table; Z represents a coupled anion; $R^2$ represents a hydrogen atom, an alkyl group, or a halogen atom; $R^3$, $R^4$, $R^5$, and $R^7$ independently represent a hydrogen atom, or an alkyl group, an aromatic group, or an aralkyl group which may have substituent groups; $R^6$ represents an alkyllysine group or a substituted alkyllysine group; $R^3$ with $R^4$ and $R^6$ with $R^7$ may be bonded to form rings; j, k, and m independently represent 0 or 1; and u represents an integer of 1 to 3.

Among the monomers having the onium groups defined by general formulas (3) to (5), following examples are especially preferable.

J represents —COO— or —CONH— and K represents a phenylene group or a substituted phenylene group. In the case where K represents a substituted phenylene group, the substituent group is preferably a hydroxyl group, a halogen atom, or an alkyl group.

M represents an alkylene group or a divalent linking group defined by a molecular formula $C_nH_{2n}O$, $C_nH_{2n}S$, or $C_nH_{2n+1}N$, wherein n represents an integer of 1 to 12.

$Y^1$ represents a nitrogen atom or a phosphorus atom and $Y^2$ represents a sulfur atom.

Z represents a halogen ion, $PF_6$, $BF_4$, or $R^8SO_3$.

$R^2$ represents a hydrogen atom or an alkyl group.

$R^3$, $R^4$, $R^5$, and $R^7$ independently represent a hydrogen atom, or an alkyl group having 1 to 10 carbon atoms, an aromatic group having 6 to 10 carbon atoms, or an aralkyl group having 7 to 10 carbon atoms which may have substituent groups.

$R^6$ represents an alkyllysine group or a substituted alkyllysine group having 1 to 10 carbon atoms.

$R^3$ with $R^4$ and $R^6$ with $R^7$ may be bonded to form rings.

The reference characters j, k, and m independently represent 0 or 1; and j and k are preferably not to be zero simultaneously.

$R^3$ represents an alkyl group having 1 to 10 carbon atoms, an aromatic group having 6 to 10 atoms, or an aralkyl group having 7 to 10 atoms which may be bonded with a substituent group.

Further more preferable examples of the monomer having the onium group defined by the general formulas (3) to (5) include are follows.

K represents a phenylene group or a substituted phenylene group. In the case where K represents a substituted phenylene group, the substituent group is a hydrogen atom or an alkyl group having 1 to 3 carbon atoms.

M represents an alkylene group having 1 or 2 carbon atoms or an alkylene group having 1 or 2 carbon atoms bonded by an oxygen atom.

Z represents chlorine ion or $R^8SO_3^-$. $R^2$ represents a hydrogen atom or a methyl group. "j" is 0 and k is 1. $R^3$ represents alkyl group having 1 to 3 carbon atoms.

Hereinafter, specific examples of the monomer having onium group used for the specific polymer of the present invention will be exemplified, but the monomer of the invention is not limited to these examples.

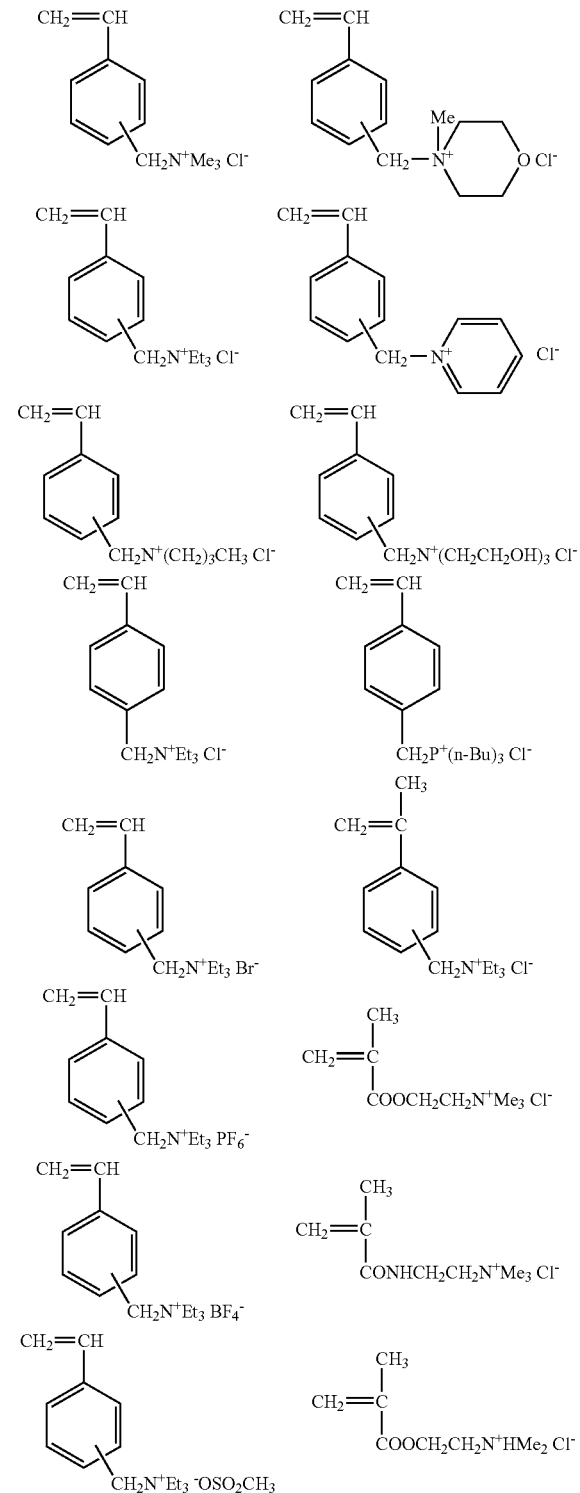

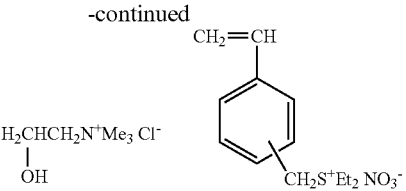

-continued

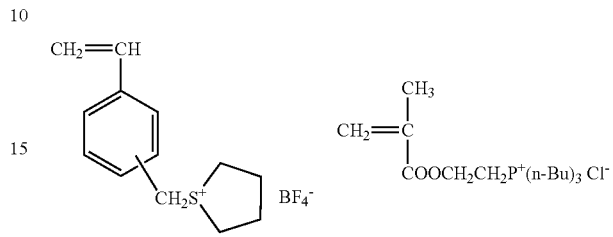

The content of the structure unit having the onium group in the specific polymer is preferably 0 to 60% by mole and more preferably 5 to 50% by mole.

Examples of the monomer having the lactone group include monomer having lactone group in the molecule thereof and an ethylene-addition polymerizable unsaturated group such as vinyl, allyl, or (meth)acryl. Examples thereof further include those having two or more lactone groups in one monomer.

Further, the lactone group and ethylenic unsaturated group are preferably bonded to each other by a single bond or a linking group and the molecular weight of such a linking group is preferably 1,000 or less.

Specific examples of the monomer having the lactone group of the present invention include pantoyl lactone (meth)acrylate, α-(meth)acryloyl-γ-butyrolactone, β-(meth)acryloyl-γ-butyrolactone or the following compounds, but the monomer of the invention is not limited to these examples (in the present specification, the term "(meth)acryl" may occasionally be used for describing at least one of acryl and methacryl).

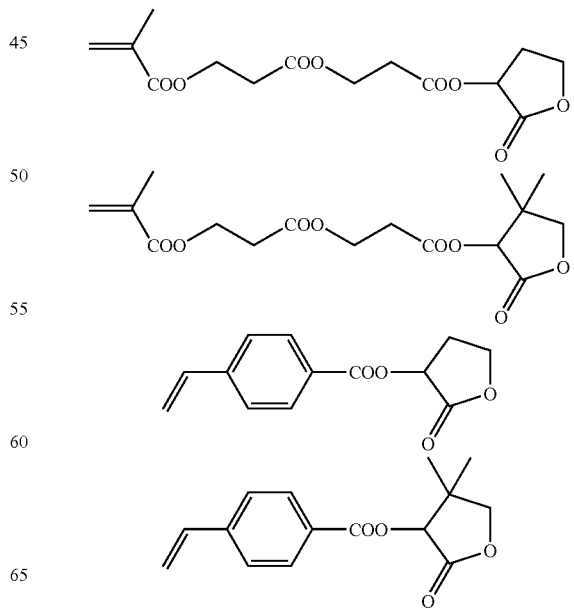

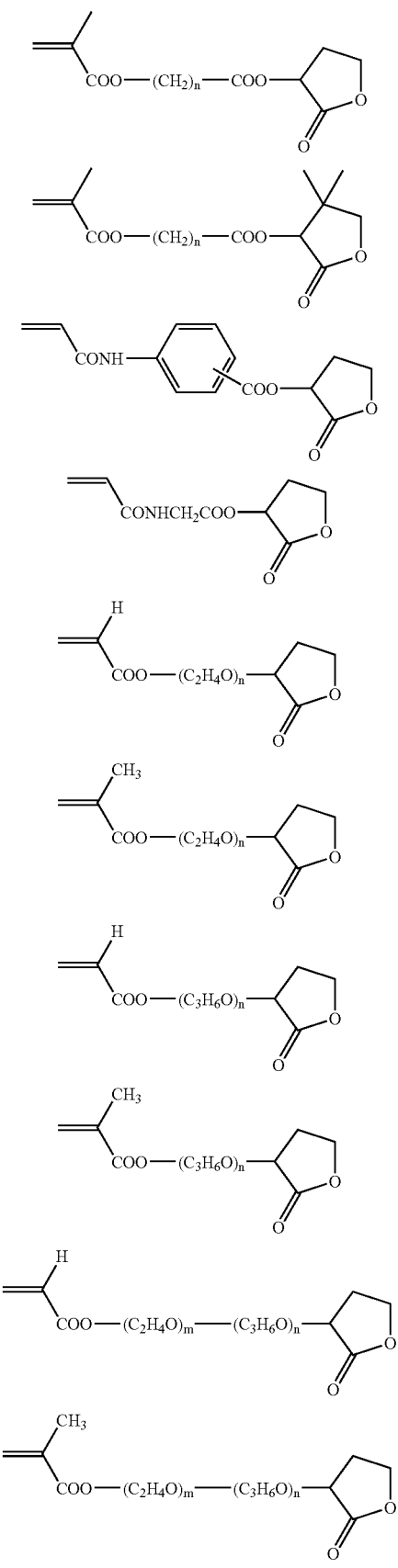

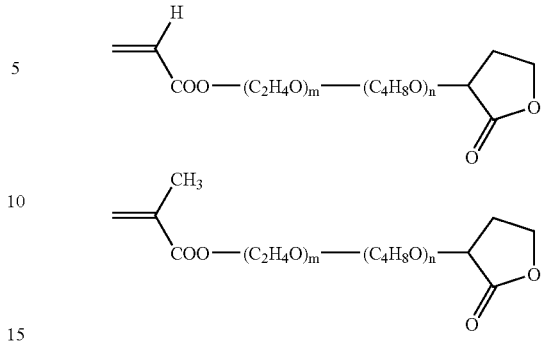

The content of the structure unit having the lactone group in the specific polymer is preferably 0 to 50% by mole and more preferably 5 to 35% by mole.

Further, the specific polymer of the invention may comprise, as the copolymer component, at least one selected from the polymerizable monomers shown in the following (1) to (14), in addition to the above-described monomers and side chain structure.

(1) Aromatic hydroxyl-containing acrylamides, methacrylamides, acrylic acid esters, methacrylic acid esters, and hydroxystyrenes such as N-(4-hydroxyphenyl)acrylamide, N-(4-hydroxyphenyl)methacrylamide, o-, m- or p-hydroxystyrene, o- or m-bromo-p-hydroxystyrene, o- or m-chloro-p-hydroxystyrene, o-, m-, or p-hydroxyphenyl acrylate or methacrylate.

(2) Unsaturated carboxylic acids such as acrylic acid, methacrylic acid, maleic acid, maleic anhydride, their half esters, itaconic acid, itaconic anhydride, and their half esters.

(3) Acrylamides such as N-(o-aminosulfonylphenyl)acrylamide, N-(m-aminosulfonylphenyl)acrylamide, N-(p-aminosulfonylphenyl)acrylamide, N-[1-(3-aminosulfonyl)naphthyl]acrylamide, and N-(2-aminosulfonylethyl)acrylamide; methacrylamides such as N-(o-aminosulfonylphenyl)methacrylamide, N-(m-aminosulfonylphenyl)methacrylamide, N-(p-aminosulfonylphenyl)methacrylamide, N-[1-(3-aminosulfonyl)naphthyl]methacrylamide, and N-(2-aminosulfonylethyl)methacrylamide; unsaturated sulfonamides of acrylic acid esters such as o-aminosulfonylphenyl acrylate, m-aminosulfonylphenyl acrylate, p-aminosulfonylphenyl acrylate, and 1-(3-aminosulfonylphenylnaphthyl) acrylate; and unsaturated sulfonamides of methacrylic acid esters such as o-aminosulfonylphenyl methacrylate, m-aminosulfonylphenyl methacrylate, p-aminosulfonylphenyl methacrylate, and 1-(3-aminosulfonylphenylnaphthyl) methacrylate.

(4) (Un)substituted phenylsulfonylacrylamide such as tosylacrylamide and (un)substituted phenylsulfonylmethacrylade such as tosylmethacrylamide.

(5) Acrylic acid esters and methacrylic acid esters having aliphatic hydroxyl groups, e.g. 2-hydroxyethyl acrylate and 2-hydroxyethyl methacrylate.

(6) (Un)substituted acrylic acid esters such as methyl acrylate, ethyl acrylate, propyl acrylate, butyl acrylate, amyl acrylate, hexyl acrylate, cyclohexyl acrylate, octyl acrylate, phenyl acrylate, benzyl acrylate, 2-chloroethyl acrylate, 4-hydroxybutyl acrylate, glycidyl acrylate, N-dimethylaminoethyl acrylate.

(7) (Un)substituted methacrylic acid esters such as methyl methacrylate, ethyl methacrylate, propyl methacrylate, butyl methacrylate, amyl methacrylate, hexyl methacrylate, cyclohexyl methacrylate, octyl methacrylate, phenyl methacrylate, benzyl methacrylate, 2-chloroethyl methacrylate, 4-hydroxybutyl methacrylate, glycidyl methacrylate, N-dimethylaminoethyl methacrylate.

(8) Acrylamides or methacrylamides such as acrylamide, methacrylamide, N-methylolacrylamide, N-methylolmethacrylamide, N-ethylacrylamide, N-ethylmethacrylamide, N-hexylacrylamide, N-hexylmethacrylamide, N-cyclohexylacrylamide, N-cyclohexylmethacrylamide, N-hydroxyethylacrylamide, N-hydroxyethylmethacrylamide, N-phenylacrylamide, N-phenylmethacrylamide, N-benzylacrylamide, N-benzylmethacrylamide, N-nitrophenylacrylamide, N-nitrophenylmethacrylamide, N-ethyl-N-phenylacrylamide, and N-ethyl-N-phenylmethacrylamide.

(9) Vinyl ethers such as ethyl vinyl ether, 2-chloroethyl vinyl ether, hydroxyethyl vinyl ether, propyl vinyl ether, butyl vinyl ether, octyl vinyl ether, and phenyl vinyl ether.

(10) Vinyl esters such as vinyl acetate, vinyl chloroacetate, vinyl butyrate, and vinyl benzoate.

(11) Styrenes such as styrene, α-methylstyrene, methylstyrene, and chlorostyrene.

(12) Vinyl ketones such as methyl vinyl ketone, ethyl vinyl ketone, propyl vinyl ketone, and phenyl vinyl ketone.

(13) Olefins such as ethylene, propylene, isobutylene, butadiene, and isoprene

(14) N-Vinyl pyrrolidone, N-vinylcarbazole, 4-vinylpyridine, acrylonitrile, and methacrylnitrile.

Hereinafter, specific examples [(P-1) to (P-13)]of the specific polymer of the invention will be exemplified, but the specific polymer of the invention is not limited to these examples.

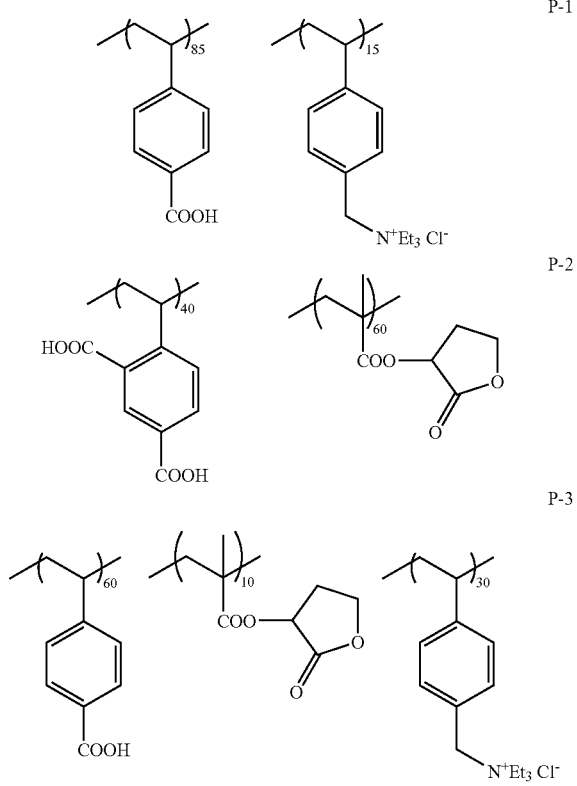

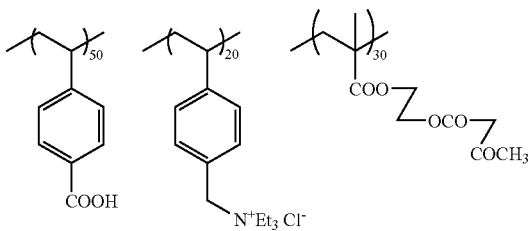

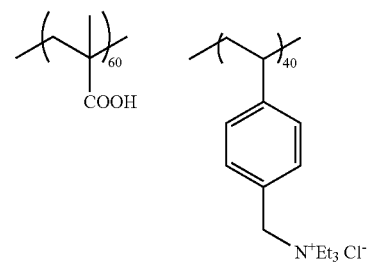

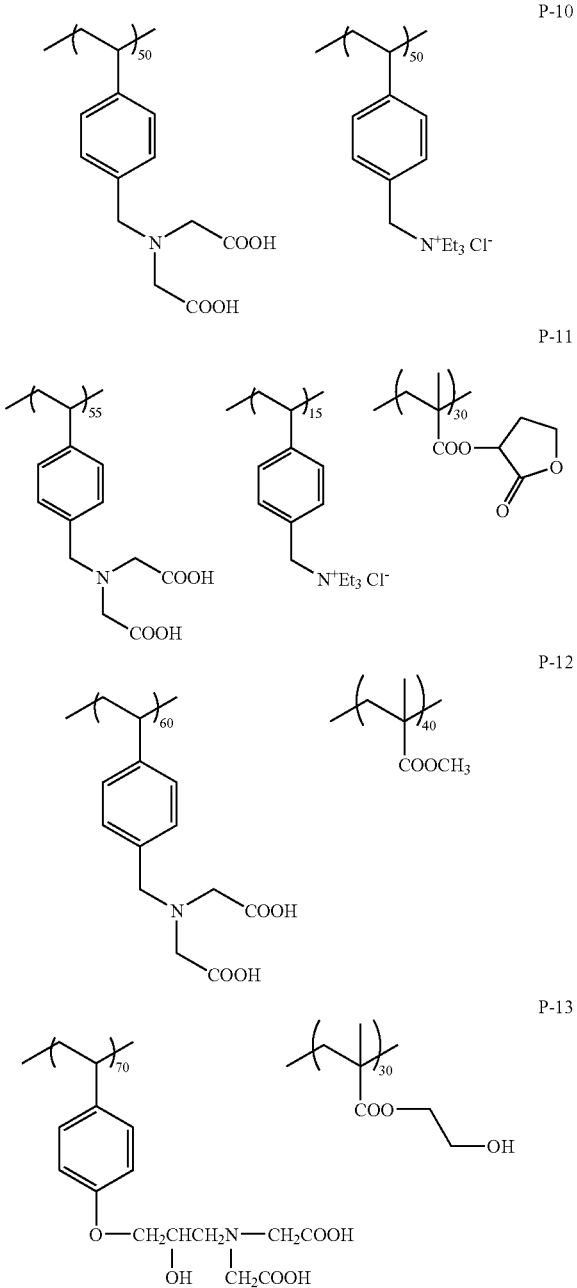

The content of the specific polymer in the intermediate layer on the basis of total solid matter composing the intermediate layer is preferably 30 to 100% by weight and 50 to 100% by weight.

(Formation of the Intermediate Layer)

The intermediate layer of the invention can be formed by applying a coating solution (a coating solution for intermediate layer formation) containing the above-mentioned respective components of the intermediate layer to a support, which will be described later, by a variety of methods. The method for coating the intermediate layer is not particularly limited and typical methods can be exemplified as follows.

That is, (1) a coating method involving applying a solution obtained by dissolving the specific polymer of the invention in an organic solvent such as methanol, ethanol, and methyl ethyl ketone, a mixture thereof, or a mixture of these organic solvents and water, to a support, and drying the solution. Or, (2) a coating method involving immersing a support in a solution obtained by dissolving the specific polymer of the invention in an organic solvent such as methanol, ethanol, and methyl ethyl ketone, a mixture thereof, or a mixture of these organic solvents and water and drying the solution, washing the support with water or air, and dying again the support, to form the intermediate layer.

In the case of the coating method (1), the solution with a concentration of 0.005 to 10% by weight in the total of the above-mentioned compounds may be applied by a variety of methods. The coating means may be any means including, for example, a bar coater coating, a rotation coating, a spray coating, and a curtain coating. In the case of the coating method (2), the concentration of the solution is 0.005 to 20% by weight, preferably 0.01 to 10% by weight, and the immersion temperature is 0 to 70° C., preferably 5 to 60° C., and the immersion period is 0.1 to 5 minutes, preferably 0.5 to 120 seconds.

The coating solution for the intermediate layer formation may be used at a controlled pH to be in a pH range of 0 to 12, preferably 0 to 6 by using basic substances such as ammonia, triethylamine, and potassium hydroxide; inorganic acids such as hydrochloric acid, phosphoric acid, sulfuric acid and nitric acid; organic sulfonic acids such as nitrobenzenesulfonic acid and naphthalenesulfonic acid; organic phosphonic acids such as phenylphosphonic acid; various acidic substances such as organic carboxylic acid including benzoic acid, cumaric acid, and malic acid; and organic chlorides naphthalene sulfonyl chloride and benzene sulfonyl chloride.

Further, to the coating solution for the intermediate layer formation, for improving the condition reproducibility of the planographic printing plate, substances absorbing UV rays, visible rays, and IR rays may be added.

The coating amount of the intermediate layer of the invention after drying is to be 1 to 100 mg/m² and preferably 2 to 70 mg/m² in total.

[Photosensitive Layer]

On the above-mentioned intermediate layer, a photosensitive layer, containing 50% by weight or more of novolak type phenol resin (hereinafter, sometimes referred to as novolak resin) and a photothermal conversion agent and recordable by IR laser beam, is formed.

At first, novolak type phenol resin will be described. The novolak resin is a resin obtained by condensation-polymerizing at least one kind of phenol resins with aldehydes or ketones in the presence of an acidic catalyst.

Here, examples of the phenols include phenol, o-cresol, m-cresol, p-cresol, 2,5-xylenol, 3,5-xylenol, o-ethylphenol, m-ethylphenol, p-ethylphenol, propylphenol, n-butylphenol, tert-butylphenol, 1-naphthol, 2-naphthol, pyrocatechol, resorcinol, hydroquinone, pyrogallol, 1,2,4-benzenetriol, fluoroglucinol, 4,4'-biphenyldiol, and 2,2'-bis(4'-hydroxyphenyl)propane, examples of the aldehydes include formaldehyde, acetaldehyde, propionaldehyde, benzaldehyde, and furfural, and examples of the ketones include acetone, methyl ethyl ketone and methyl isobutyl ketone.

Preferable condensed polymers are those obtained from phenols selected from phenol, o-cresol, m-cresol, p-cresol, 2,5-xylenol, 3,5-xylenol, and resorcinol and either aldehydes selected from formaldehyde, acetaldehyde, and propionaldehyde or ketones. Particularly preferable condensed polymers are those obtained from mixed phenols in which mixing ratios of m-cresol:p-cresol:2,5-xylenol:3,5-xylenol:resorcinol by mole=(40 to 100):(0 to 50):(0 to 20):(0 to 20):(0 to 20) or mixed phenols in which mixing ratios of phenol:m-cresol:p-cresol by mole=(0 to 100):(0 to 70):(0 to 60) and formaldehyde.

These novolak resins to be employed have a weight average molecular weight on the basis of polystyrene conversion by gel permeation chromatography (hereinafter, simply referred to as "weight average molecular weight") preferably in a range of 500 to 20,000, further preferably in a range of 1,000 to 15,000, and further more preferably 3,000 to 12,000. If the weight average molecular weight is in the aforementioned range, sufficient film formability and excellent alkali developability of exposed portions can be obtained and therefore it is preferable.

In the case of using the above-mentioned novolak resins as the binder resin of the photosensitive layer, only one type of the novolak resins may be used or two ore more types of the novolak resins may be used in combination. The binder resin may entirely be the above-mentioned novolak resin or may contain other resins in combination. Even in the case of using other resins in combination, the novolak resin is preferably a main binder and the ratio of the novolak resin in the binder resin components composing the photosensitive layer is required to be 50% by weight or more.

The content of the above-mentioned novolak resin is required to be 50% by weight or more with respect to all the solid components composing the photosensitive layer, and further preferably in a range of 65 to 99.9% by weight.

As the binder resins usable in combination, examples thereof include commonly used alkali-soluble resins which are water-insoluble and alkali-soluble and have acidic groups in at least one of the main chain and side chains of the polymer. Preferable examples to be used as the phenol resins other than the novolak resin include resol resin, polyvinyl phenol resin, and phenolic hydroxyl-containing acrylic resin. Examples of resin usable in combination include polymers described in the specifications of, for example, JP-A No. 11-44956, Japanese Patent Application No. 2001-368587 filed by the applicants of the present invention, and Japanese Patent Application No. 2002-81044.

The photosensitive layer of the invention may contain a photothermal conversion agent. As the photothermal conversion agent to be use here, any substances can be used without limit in the absorption wavelength region as long as they can absorb the photo-energy radiation beam and generate heat In terms of availability and applicability to the high output power laser, preferable examples thereof include IR-absorptive dyes or pigments having the maximum absorption at wavelength of 760 nm to 1,200 nm.

The dyes may be commercially available ones and known ones described in publications such as "Dye Handbook" (edited by the Society of Synthesis Organic Chemistry, Japan, and published in 1970). Specific examples thereof include azo dyes; metal complex azo dyes, pyrazolone azo dyes, naphthoquinone dyes, anthraquinone dyes, phthalocyanine dyes, carbonium dyes, quinoneimine dyes, methine dyes, cyanine dyes, squalirium dyes, pyrylium dyes, metal thiolate complexes, oxonol dyes, diimonium dyes, aminium dyes, and croconium dyes.

Preferable examples of the dye include cyanine dyes described in JP-A Nos. 58-125246, 59-84356, 59-202829, and 60-78787; methine dyes described in JP-A Nos. 58-173696, 58-181690, and 58-194595; naphthoquinone dyes described in JP-A Nos. 58-112793, 58-224793, 59-48187, 59-73996, 60-52940, and 60-63744; squalirium dyes described in JP-A No. 58-112792; and cyanine dyes described in GB Patent No. 434,875.

Other preferable examples of the dye include near infrared absorbing sensitizers described in U.S. Pat. No. 5,156,938; substituted arylbenzo(thio)pyrylium salts described in U.S. Pat. No. 3,881,924; trimethinethiapyrylium salts described in JP-A No. 57-142645 (U.S. Pat. No. 4,327,169); pyrylium type compounds described in JP-A Nos. 58-181051, 58-220143, 59-41363, 59-84248, 59-84249, 59-146063, and 59-146061; cyanine dyes described in JP-A No. 59-216146; pentamethinethiopyrylium salts described in U.S. Pat. No. 4,283,475; and pyrylium compounds described in Japanese Patent Application Publication (JP-B) Nos. 5-13514 and 5-19702.

Additional preferable examples of the dye include near infrared absorbing dyes represented by formulae (I) and (II) as described in U.S. Pat. No. 4,756,993.

Among these dyes, particularly preferable are cyanine dyes, phthalocyanine dyes, oxonol dyes, squalirium dyes, pyrylium salts, thiopyrylium dyes, and nickel thiolate complexes. Dyes represented by the following general formulae (a) to (e) are also preferable since such dyes are excellent in terms of photothermal conversion efficiency. The cyanine dyes represented by the following general formula (a) are most preferable for the following reason: when the dyes are used in the photosensitive composition of the invention, the dyes manifest a high degree of interaction with the alkali-soluble resin, and the dyes are also excellent in terms of stability and economy.

General formula (a)

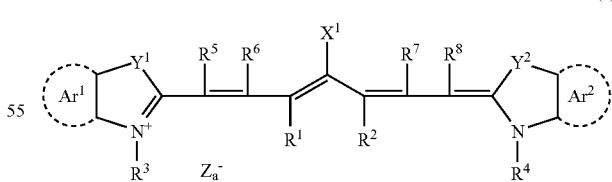

In general formula (a), $X^1$ represents a hydrogen atom, a halogen atom, —$NPh_2$, $X^2$-$L^1$ (wherein $X^2$ represents an oxygen atom or a sulfur atom, $L^1$ represents a hydrocarbon group having 1 to 12 carbon atoms, an aromatic cyclic group having a heteroatom, or a hydrocarbon group containing a heteroatom and having 1 to 12 carbon atoms, and the heteroatom referred to herein is N, S, O, a halogen atom, or Se), or a group represented by the following:

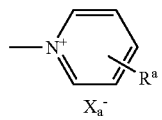

wherein Xa⁻ has the same definition as Za⁻, which will be described at a later time, and $R^a$ represents a substituent selected from a hydrogen atom, an alkyl group, an aryl group, a substituted or unsubstituted amino group, or a halogen atom;

$R^1$ and $R^2$ each independently represents a hydrocarbon group having 1 to 12 carbon atoms, and from the viewpoint of the storage stability of the photosensitive composition of the invention when it is used in a coating solution for forming a recording layer of a planographic printing plate precursor, it is preferable that $R^1$ and $R^2$ each independently represents a hydrocarbon group having 2 or more carbon atoms, and more preferably $R^1$ and $R^2$ are bonded to each other to form a 5-membered or 6-membered ring.

$Ar^1$ and $Ar^2$, which may be the same or different, each represent an aromatic hydrocarbon group which may have a substituent. Preferable examples of the aromatic hydrocarbon group include benzene and naphthalene rings. Preferable examples of the substituent include hydrocarbon groups having 12 or less carbon atoms, halogen atoms, and alkoxy groups having 12 or less carbon atoms.

$Y^1$ and $Y^2$, which may be the same or different, each represents a sulfur atom, or a dialkylmethylene group having 12 or less carbon atoms.

$R^3$ and $R^4$, which may be the same or different, each represents a hydrocarbon group which has 20 or less carbon atoms and may have a substituent. Preferable examples of the substituent include alkoxy groups having 12 or less carbon atoms, a carboxyl group, and a sulfo group. $R^5$, $R^6$, $R^7$ and $R^8$, which may be the same or different, each represents a hydrogen atom, or a hydrocarbon group having 12 or less carbon atoms, and since the raw materials thereof can easily be obtained, each preferably represents a hydrogen atom.

Za⁻ represents a counter anion. However, in a case where the cyanine dye represented by general formula (a) has an anionic substituent in the structure thereof and there is accordingly no need to neutralize electric charges in the dye, Za⁻ is not required. From the viewpoint of the storage stability of the recording layer coating solution, Za⁻ is preferably an ion of a halogen, perchlorate, tetrafluroborate, hexafluorophosphate, carboxylate or sulfonate. From the viewpoints of compatibility of the dye with the alkali-soluble resin and solubility in the coating solution, Za⁻ is preferably a halogen ion, or an organic acid ion such as a carboxylic acid ion or sulfonic acid ion, more preferably a sulfonic acid ion, and even more preferably an arylsulfonic acid ion.

Specific examples of the cyanine dye represented by general formula (a), and which can be preferably used in the invention, include dyes in JP-A No. 2001-133969 (paragraphs [0017] to [0019]), JP-A No. 2002-40638 (paragraphs [0012] to [0038]), and JP-A No. 2002-23360 (paragraphs [0012] to [0023]), as well as dyes illustrated below.

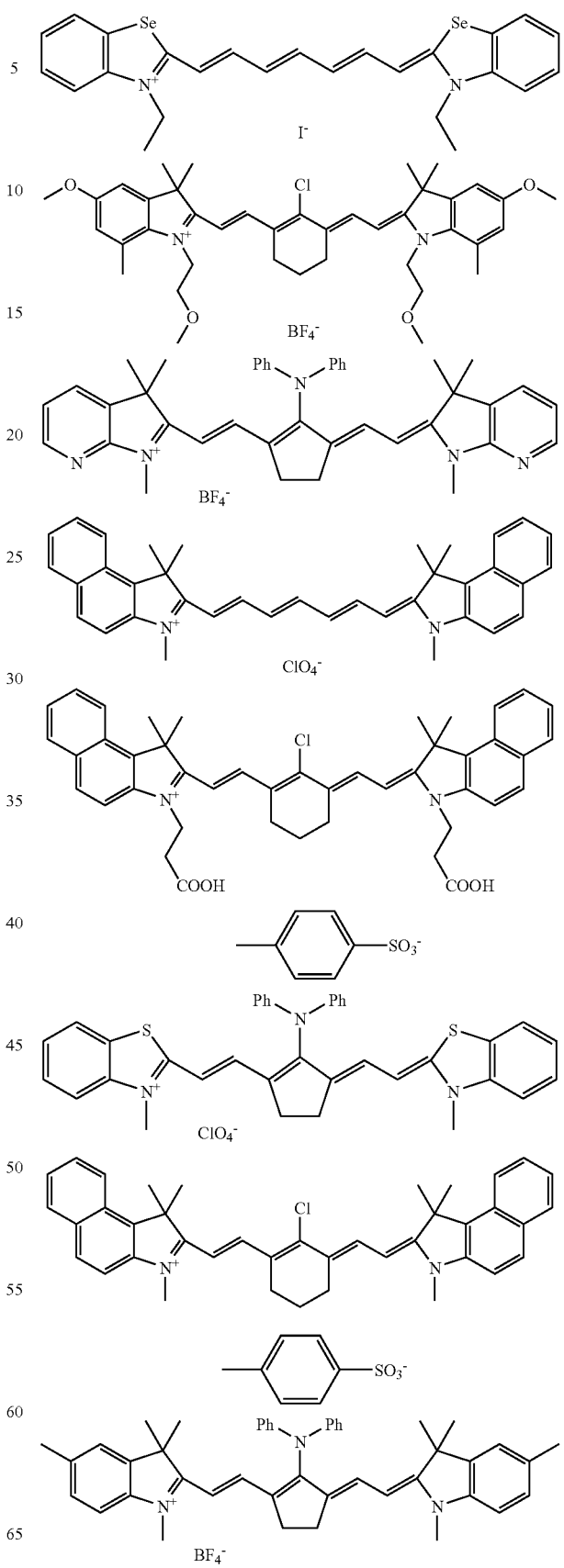

-continued

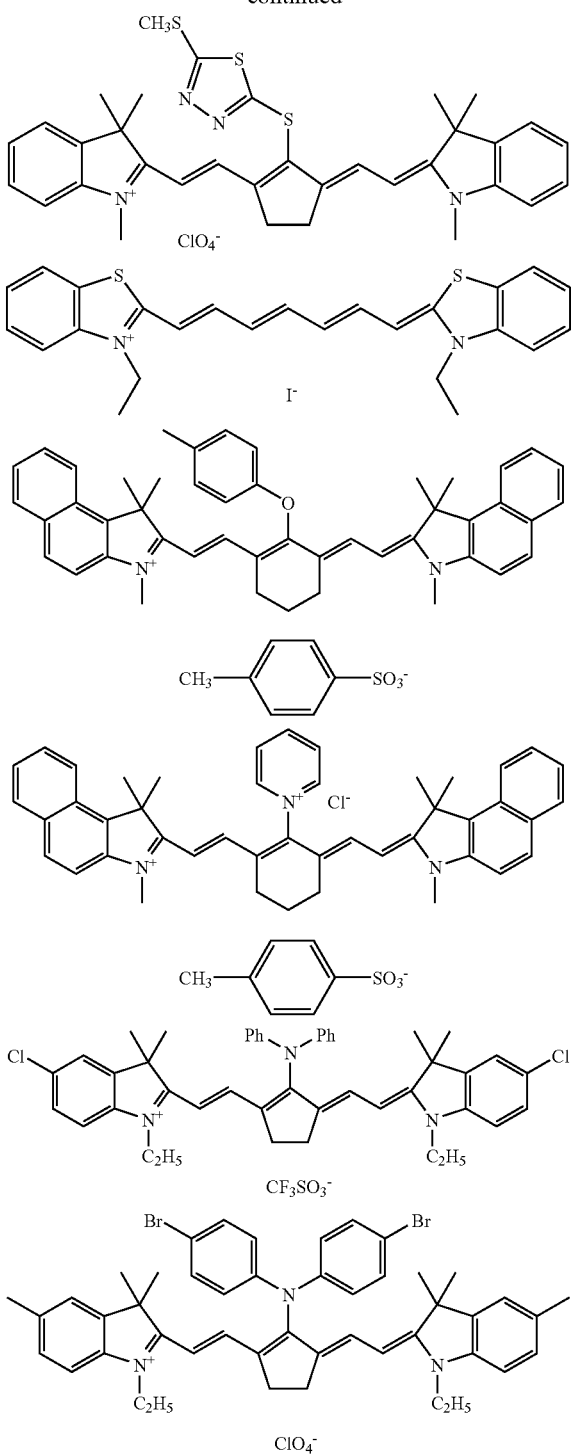

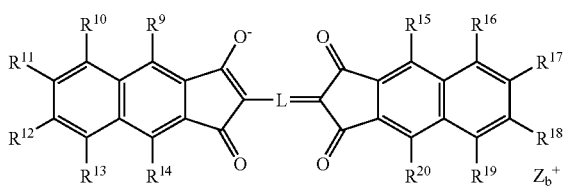

General formula (b)

In general formula (b), L represents a methine chain having 7 or more conjugated carbon atoms, and the methine chain may have one or more substituent. The substituents may be bonded to each other to form a cyclic structure. $Zb^+$ represents a counter cation. Preferable examples of the counter cation include ammonium, iodonium, sulfonium, phosphonium and pyridinium ions, and alkali metal cations (such as $Ni^+$, $K^+$ and $Li^+$).

$R^9$ to $R^{14}$ and $R^{15}$ to $R^{20}$ each independently represents a substituent selected from hydrogen atom, halogen atom, and cyano, alkyl, aryl, alkenyl, alkynyl, carbonyl, thio, sulfonyl, sulfinyl, oxy and amino groups; or a substituent obtained by combining two or three from among these substituents. Two or three out of $R^9$ to $R^{14}$ and $R^{15}$ to $R^{20}$ may be bonded to each other to form a cyclic structure.

A dye wherein L in general formula (b) represents a methine chain having 7 conjugated carbon atoms, and each of $R^9$ to $R^{14}$ and $R^{15}$ to $R^{20}$ represents a hydrogen atom, is preferable since such a dye can be easily obtained and exhibits advantageous effects.

Specific examples of the dye represented by general formula (b), and which can be preferably used in the invention, are illustrated below.

General formula (c)

In general formula (c), $Y^3$ and $Y^4$ each independently represent an oxygen, sulfur, selenium or tellurium atom; M represents a methine chain having 5 or more conjugated carbon atoms; $R^{21}$ to $R^{24}$ and $R^{25}$ to $R^{28}$, which may be the same or different, each represents a hydrogen or halogen atom, or a cyano, alkyl, aryl, alkenyl, alkynyl, carbonyl, thio, sulfonyl, sulfinyl, oxy or amino group; and $Za^-$ represents a counter anion, and has the same meaning as $Za^-$ in general formula (a).

Specific examples of the dye which is represented by general formula (c) and which can be preferably used in the invention, are illustrated below.

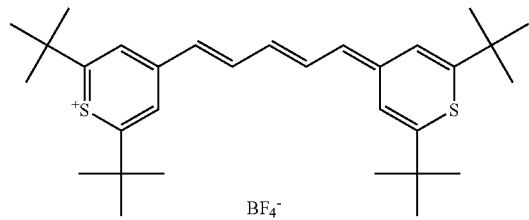
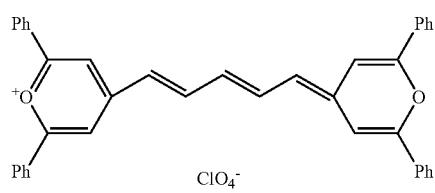
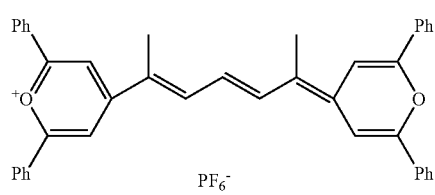
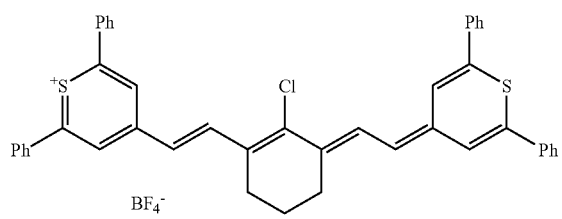
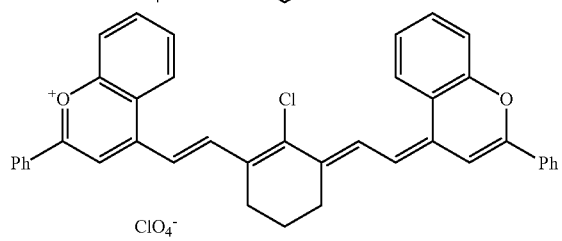

General formula (d)

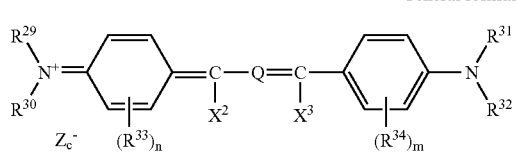

In general formula (d), $R^{29}$ to $R^{31}$ each independently represents a hydrogen atom, an alkyl group or an aryl group; $R^{33}$ and $R^{34}$ each independently represents an alkyl group, a substituted oxy group, or a halogen atom; n and m each independently represents an integer of 0 to 4; and $R^{29}$ and $R^{30}$, or $R^{31}$ and $R^{32}$ may be bonded to each other to form a ring, or $R^{29}$ and/or $R^{30}$ may be bonded to $R^{33}$ to form a ring and $R^{31}$ and/or $R^{32}$ may be bonded to $R^{34}$ to form a ring.

When plural $R^{33}$'s and $R^{34}$'s are present, $R^{33}$'s may be bonded to each other to form a ring, or $R^{34}$'s may be bonded to each other to form a ring.

$X^2$ and $X^3$ each independently represents a hydrogen atom, an allyl group or an aryl group, and at least one of $X^2$ and $X^3$ represents a hydrogen atom or an alkyl group.

Q represents a trimethine group or a pentamethine group which may have a substituent, and may be combined with an bivalent organic group to form a cyclic structure. $Zc^-$ represents a counter anion and has the same meanings as $Za^-$ in general formula (a).

Specific examples of the dye represented by general formula (d) and which can be preferably used in the invention, are illustrated below.

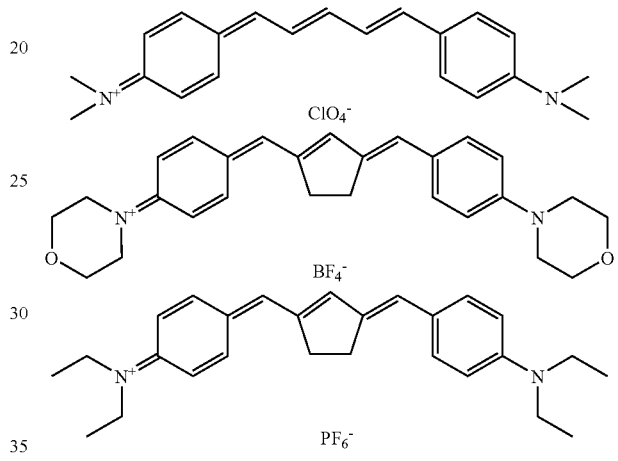

General formula (e)

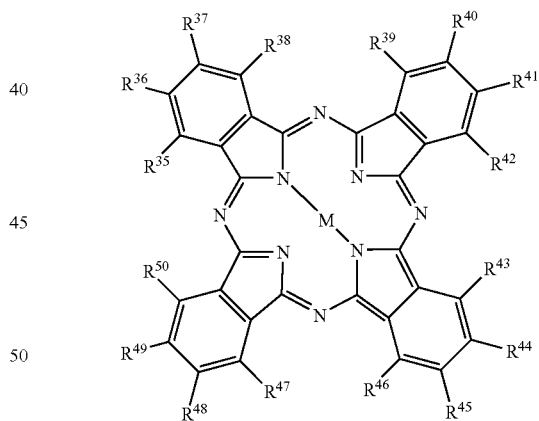

In general formula (e), $R^{35}$ to $R^{50}$ each independently represents a hydrogen or halogen atom, or a cyano, alkyl, aryl, alkenyl, alkynyl, hydroxyl, carbonyl, thio, sulfonyl, sulfinyl, oxy or amino group, or an onium salt structure, each of which may have a substituent; M represents two hydrogen atoms, a metal atom, a halo metal group, or an oxy metal group. Examples of the metal contained therein include atoms in IA, IIA, IIIB and IVB groups in the periodic table, transition metals in the first, second and third periods therein, and lanthanoid elements. Among these examples, preferable are copper, magnesium, iron, zinc, cobalt, aluminum, titanium, and vanadium.

Specific examples of the dye represented by general formula (e) and which can be preferably used in the invention, are illustrated below.

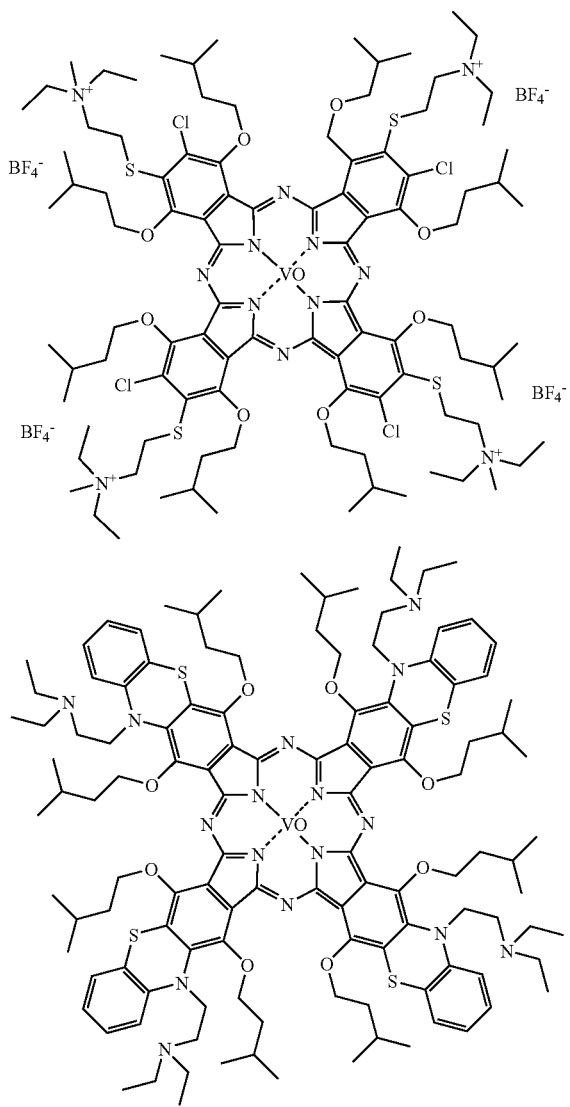

The pigment used as the infrared absorbent in the invention may be a commercially available pigment or a pigment described in publications such as Color Index (C.I.) Handbook, "Latest Pigment Handbook" (edited by Japan Pigment Technique Association, and published in 1977), "Latest Pigment Applied Technique" (by CMC Publishing Co., Ltd. in 1986), and "Printing Ink Technique" (by CMC Publishing Co., Ltd. in 1984).

Examples of the pigment include black pigments, yellow pigments, orange pigments, brown pigments, red pigments, purple pigments, blue pigments, green pigments, fluorescent pigments, metal powder pigments, and polymer-bonded dyes. Specifically, the following can be used: insoluble azo pigments, azo lake pigments, condensed azo pigments, chelate azo pigments, phthalocyanine pigments, anthraquinone pigments, perylene and perynone pigments, thioindigo pigments, quinacridone pigments, dioxazine pigments, isoindolinone pigments, quinophthalone pigments, dyeing lake pigments, azine pigments, nitroso pigments, nitro pigments, natural pigments, fluorescent pigments, inorganic pigments, and carbon black. Among these pigments, carbon black is preferable.

These pigments may be used with or without surface treatment. Examples of surface treatment include a method of coating the surface of the pigments with resin or wax; a method of adhering a surfactant onto the surface; and a method of bonding a reactive material (such as a silane coupling agent, an epoxy compound, or a polyisocyanate) to the pigment surface. The surface treatment methods are described in "Nature and Application of Metal Soap" (Saiwai Shobo), "Printing Ink Technique" (by CMC Publishing Co., Ltd. in 1984). And "Latest Pigment Applied Technique" (by CMC Publishing Co., Ltd. in 1986.

The particle size of the pigment is preferably from 0.01 to 10 μm, more preferably from 0.05 to 1 μm, and even more preferably from 0.1 to 1 μm. When a particle size is within the preferable range, a superior dispersion stability of the pigment in the photosensitive composition can be obtained, whereby, when the photosensitive composition of the invention is used for a recording layer of the photosensitive printing plate precursor, it is possible to form a homogeneous recording layer.

The method for dispersing the pigment may be a known dispersing technique used to produce ink or toner. Examples of a dispersing machine, which can be used, include an ultrasonic disperser, a sand mill, an attriter, a pearl mill, a super mill, a ball mill, an impeller, a disperser, a KD mill, a colloid mill, a dynatron, a three-roll mill, and a pressing kneader. Details are described in "Latest Pigment Applied Technique" (by CMC Publishing Co., Ltd. in 1986).

From the viewpoints of sensitivity, uniformity of the film to be formed and durability, the pigment or dye can be added to the photosensitive composition in a ratio of 0.01 to 50%, preferably 0.1 to 10%, and more preferably 0.5 to 10% (in the case of the dye) or 0.1 to 10% (in the case of pigment) by mass, relative to the total solid contents which constitute the photosensitive composition.

[Other Components]

At the time of forming the photosensitive layer of an image recording material of the invention, a variety of additives may optionally be added. Substances such as onium salts, o-quinonediazido compounds, and sulfonic acid alkyl esters, which are thermally decomposable and substantially suppress the solubility of alkali-soluble resins in the state that the substances are not decomposed (i.e., decomposable and dissolution suppressing agent), are preferably used, in particular, for improving the dissolution inhibiting property of the image forming portions to the developer. As the decomposable and dissolution suppressing agent, preferable examples thereof include onium salts such as diazonium salts, iodonium salts, sulfonium salts, and ammonium salts and o-quinonediazido compounds. Among these examples, onium salts such as diazonium salts, iodonium salts and sulfonium salts are more preferable, and diazonium salts are especially preferable as the thermally decomposable and dissolution suppressing agent.

Preferable examples of the onium salt used in the invention include diazonium salts described in S. I. Schlesinger, Photogr. Sci. Eng., 18, 387 (1974), T. S. Bal et al., Polymer, 21, 423 (1980), and JP-A No. 5-158230; ammonium salts described in U.S. Pat. Nos. 4,069,055 and 4,069,056, and JP-A No.3-140140; phosphonium salts described in D. C. Necker et al, Macromolecules, 17, 2468 (1984), C. S. Wen et al., Teh, Proc. Conf. Rad. Curing ASIA, p478 Tokyo, Oct. (1988), and U.S. Pat. Nos. 4,069,055 and 4,069,056; iodonium salts described in J. V. Crivello et al., Macromolecules, 10 (6), 1307 (1977), Chem. & Eng. News, Nov. 28, p31 (1988), EP No.104,143, U.S. Pat. Nos. 5,041,358 and 4,491, 628, and JP-A Nos. 2-150848 and 2-296514; sulfonium salts described in J. V. Crivello et al., Polymer J. 17, 73 (1985), J. V. Crivello et al., J. Org. Chem., 43, 3055 (1978), W. R. Watt et al., J. Polymer Sci., Polymer Chem. Ed., 22, 1789 (1984), J. V. Crivello et al., Polymer Bull., 14, 279 (1985), J. V. Crivello et al., Macromolecules, 14 (5), 1141 (1981), J. V. Crivello et al., J. Polymer Sci., Polymer Chem. Ed., 17, 2877 (1979), EP Nos. 370,693, 233,567, 297,443 and 297, 442, U.S. Pat. Nos. 4,933,377, 3,902,114, 5,041,358, 4,491, 628, 4,760,013, 4,734,444 and 2,833,827, and DE Patent Nos. 2,904,626, 3,604,580 and 3,604,581; selenonium salts described in J. V. Crivello et al., Macromolecules, 10 (6), 1307 (1977), J. V. Crivello et al., J. Polymer Sci., Polymer Chem. Ed., 17, 1047 (1979); arsonium salts described in C. S. Wen et al., and The Proc. Conf. Rad. Curing ASIA, p478, Tokyo, Oct (1988).

Among such onium salts, diazonium salts are particularly preferable from the viewpoints of both their capacity of hindering dissolution, and their thermal decomposability. The diazonium salts represented by general formula (I) in the JP-A No. 5-158230 and the diazonium salts represented by general formula (1) in JP-A No. 11-143064 are more preferable, and diazonium salts represented by general formula (1) in the JP-A No. 11-143064, which have low absorption wavelength peaks within the visible ray range, are most preferable.

Examples of the counter ion of the onium salt include tetrafluoroboric acid, hexafluorophosphoric acid, triisopropylnaphthalenesulfonic acid, 5-nitro-o-toluenesulfonic acid, 5-sulfosalicylic acid, 2,5-dimethylbenzenesulfonic acid, 2,4, 6-trimethylbenzenesulfonic acid, 2-nitrobenzenesulfonic acid, 3-chlorobenzenesulfonic acid, 3-bromobenzenesulfonic acid, 2-fluorocaprylnaphthalenesulfonic acid, dodecylbenzenesulfonic acid, 1-naphthol-5-sulfonic acid, 2-methoxy-4-hydroxy-5-benzoylbenzenesulfonic acid, and p-toluenesulfonic acid. Among these examples, hexafluorophosphoric acid, and alkylaromatic sulfonic acids such as triisopropylnaphthalenesulfonic acid and 2,5-dimethylbenzenesulfonic acid are particularly preferable.

The quinonediazide is preferably an o-quinonediazide compound. The o-quinonediazide compound used in the invention is a compound having at least one o-quinonediazide group and having an alkali-solubility increased by being thermally decomposed. The compound may be any one of compounds having various structures.

In other words, the o-quinonediazide compound assists the solubility of the photosensitive material both from the viewpoint of the effects of being thermally decomposed, and thereby losing the function of suppressing the dissolution of the binder, and the effect that the o-quinonediazide itself is changed into an alkali-soluble material.

Preferable examples of the o-quinonediazide compound used in the invention include compounds described in J. Coser, "Light-Sensitive Systems" (John Wiley & Sons. Inc.), pp. 339-352. Particularly preferable are sulfonic acid esters or sulfonamides of o-quinonediazide made to react with various aromatic polyhydroxy compounds or with aromatic amino compounds.

Further preferable examples include an ester made from benzoquinone-(1,2)-diazidesulfonic acid chloride or naphthoquinone-(1,2)-diazide-5-sulfonic acid chloride and pyrogallol-acetone resin, as described in JP-B No. 43-28403; and an ester made from benzoquinone-(1,2)-diazidesulfonic acid chloride or naphthoquinone-(1,2)-diazide-5-sulfonic acid chloride and phenol-formaldehyde resin.

Additional preferable examples include an ester made from naphthoquinone-(1,2)-diazide-4-sulfonic acid chloride and phenol-formaldehyde resin or cresol-formaldehyde resin; and an ester made from naphthoquinone-(1,2)-diazide-4-sulfonic acid chloride and pyrogallol-acetone resin.

Other useful o-quinonediazide compounds are reported in unexamined or examined patent documents, examples of which include JP-A Nos. 47-5303, 48-63802, 48-63803, 48-96575, 49-38701 and 48-13354, JP-B No. 41-11222, 45-9610 and 49-17481, U.S. Pat. Nos. 2,797,213, 3,454,400, 3,544,323, 3,573,917, 3,674,495 and 3,785,825, GB. Patent Nos. 1,227,602, 1,251,345, 1,267,005, 1,329,888 and 1,330, 932, and DE Patent No. 854,890.

When the photosensitive composition of the invention is used as a recording layer of a planographic printing plate precursor, the amount of onium salt and/or o-quinonediazide compound added as the decomposable dissolution suppresser(s) is preferably from 0.1 to 10%, more preferably from 0.1 to 5%, and even more preferably from 0.2 to 2% by relative to the total solid contents of the recording layer. The onium salts and the o-quinonediazide compounds may be used either independently or in the form of mixtures of two or more thereof.

The amount of additives other than the o-quinonediazide compound added is preferably from 0 to 5%, more preferably from 0 to 2%, and even more preferably from 0.1 to 1.5% by mass. The additives and the binder used in the invention are preferably incorporated into the same layer.

A dissolution suppresser having no decomposability may be used in combination. Preferable examples thereof include sulfonic acid esters, phosphoric acid esters, aromatic carboxylic acid esters, aromatic disulfones, carboxylic acid anhydrides, aromatic ketones, aromatic aldehydes, aromatic amines, and aromatic ethers, details of which are described in JP-A No. 10-268512; acidic color-developable dyes which have a lactone skeleton, an N,N-diarylamide skeleton or a diarylmethylimino skeleton and also function as a coloring agent, details of which are described in JP-A No. 11-190903; and nonionic surfactants described, details of which are described in JP-A No. 2000-105454.

In order to strengthen discrimination of images to be obtained (discrimination of hydrophobicity and hydrophilicity), or to improve the resistance of the surface against scratches, the following also may be used: a polymer containing, as a polymerization component, a (meth)acrylic monomer having in the 2 or 3 perfluoroalkyl groups having 3 to 20 carbon atoms. When the photosensitive composition of the invention is used as a recording layer of a planographic printing plate precursor, in relation to the total solid contents of the recording layer, the amount of this compound added is preferably from 0.1 to 10%, and more preferably from 0.5 to 5% by mass.

In order to provide the photosensitive composition of the invention with resistance against scratches, a compound for lowering the static friction coefficient of the surface may be added to the composition. Specific examples thereof include long-chain alkyl carboxylic acid esters as described in U.S. Pat. No. 6,117,913. When the photosensitive composition of the invention is used as a recording layer of a planographic printing plate precursor, in relation to the total solid contents of the recording layer, the amount of such a compound added is preferably from 0.1 to 10%, and more preferably from 0.5 to 5% by mass.

The photosensitive composition of the invention may, whenever necessary, contain a compound having an acidic group of low-molecular weight. Examples of such an acidic group include sulfonic acid, carboxylic acid and phosphoric acid groups. Compounds having a sulfonic acid group are particularly preferable. Specific examples include aromatic sulfonic acids and aliphatic sulfonic acids such as p-toluenesulfonic acid and naphthalenesulfonic acid.

In order to enhance sensitivity, the photosensitive composition may also contain a cyclic acid anhydride, a phenolic compound, or an organic acid.

Examples of cyclic acid anhydride include phthalic anhydride, tetrahydrophthalic anhydride, hexahydrophthalic anhydride, 3,6-endooxy-Δ4-tetrahydrophthalic anhydride, tetrachlorophthalic anhydride, maleic anhydride, chloromaleic anhydride, α-phenylmaleic anhydride, succinic anhydride, and pyromellitic anhydride which are described in U.S. Pat. No. 4,115,128.

Examples of phenolic compound include bisphenol A, p-nitrophenol, p-ethoxyphenol, 2,4,4'-trihydroxybenzophenone, 2,3,4-trihydroxybenzophenone, 4-hydroxybenzophenone, 4,4',4"-trihydroxytriphenylmethane, 4,4',3",4"-tetrahydroxy-3,5,3',5'-tetramethyltriphenylmethane.

Examples of the organic acid include sulfonic acids, sulfonic acids, alkylsulfuric acids, phosphonic acids, phosphates, and carboxylic acids, which are described in JP-A No. 60-88942 or 2-96755. Specific examples thereof include p-toluenesulfonic acid, dodecylbenzenesulfonic acid, p-toluenesulfinic acid, ethylsulfuric acid, phenylphosphonic acid, phenylphosphinic acid, phenyl phosphate, diphenyl phosphate, benzoic acid, isophthalic acid, adipic acid, p-toluic acid, 3,4-dimethoxybenzoic acid, phthalic acid, terephthalic acid, 4-cyclohexene-1,2-dicarboxylic acid, erucic acid, lauric acid, n-undecanoic acid, and ascorbic acid.

When the cyclic acid anhydride, the phenol or the organic acid is added to a recording layer of a planographic printing plate precursor, the ratio thereof in the recording layer is preferably from 0.05 to 20%, more preferably from 0.1 to 15%, and even more preferably from 0.1 to 10% by mass.

When the photosensitive composition according to the invention is used in a recording layer coating solution for a planographic printing plate precursor, in order to enhance stability in processes which affect conditions of developing, the following can be added: nonionic surfactants as described in JP-A Nos. 62-251740 and 3-208514; amphoteric surfactants as described in JP-A Nos. 59-121044 and 4-13149; siloxane compounds as described in EP No. 950517; and copolymers made from a fluorine-containing monomer as described in JP-A No. 11-288093.

Specific examples of nonionic surfactants include sorbitan tristearate, sorbitan monopalmitate, sorbitan trioleate, monoglyceride stearate, and polyoxyethylene nonyl phenyl ether. Specific examples of amphoteric surfactants include alkyldi(aminoethyl)glycine, alkylpolyaminoethylglycine hydrochloride, 2-alkyl-N-carboxyethyl-N-hydroxyethylimidazolinium betaine and N-tetradecyl-N,N'-betaine type surfactants (trade name: "Amolgen K", manufactured by Daiichi Kogyo Seiyaku Co., Ltd.).

The siloxane compounds are preferably block copolymers made from dimethylsiloxane and polyalkylene oxide. Specific examples thereof include polyalkylene oxide modified silicones (trade names: DBE-224, DBE-621, DBE-712, DBE-732, and DBE-534, manufactured by Chisso Corporation; trade name: Tego Glide 100, manufactured by Tego Co., Ltd.).

The content of the nonionic surfactant and/or the amphoteric surfactant in the photosensitive composition is preferably from 0.05 to 15% by mass, and more preferably from 0.1 to 5% by mass.

To the photosensitive composition of the invention may be added a printing-out agent for obtaining a visible image immediately after the photosensitive composition of the invention has been heated by exposure to light, or a dye or pigment as an image coloring agent.

A typical example of a printing-out agent is a combination of a compound which is heated by exposure to light, thereby emitting an acid (an optically acid-generating agent), and an organic dye which can form salts (salt formable organic dye).

Specific examples thereof include combinations of an o-naphthoquinonediazide-4-sulfonic acid halogenide with a salt-formable organic dye, described in JP-A Nos. 50-36209 and 53-8128; and combinations of a trihalomethyl compound with a salt-formable organic dye, described in each of JP-A Nos. 53-36223, 54-74728, 60-3626, 61-143748, 61-151644 and 63-58440.

The trihalomethyl compound is classified into an oxazol compound or a triazine compound. Both of the compounds provide excellent in stability over the passage of time and produce a vivid printed-out image.

As the image coloring agent, a dye different from the above-mentioned salt-formable organic dye may be used. Preferable examples of such a dye, and of the salt-formable organic dye, include oil-soluble dyes and basic dyes.

Specific examples thereof include Oil yellow # 101, Oil Yellow # 103, Oil Pink #312, Oil Green BG, Oil Blue BOS, Oil Blue #603, Oil Black BY, Oil Black BS, and Oil Black T-505 (each of which is manufactured by Orient Chemical Industries Ltd.); Victoria Pure Blue, Crystal Violet (CI42555), Methyl Violet (CI42535), Ethyl Violet, Rhodamine B (CI145170B), Malachite Green (CI42000), and Methylene Blue (CI52015).

Dyes described in JP-A No. 62-293247 are particularly preferable. These dyes may be added to the photosensitive composition at a ratio of 0.01 to 10% by mass, and preferably 0.1 to 3% by mass, relative to the total solid contents therein.

Whenever necessary, a plasticizer may be added to the photosensitive composition of the invention to give flexibility to a coating film made from the composition. Examples of the plasticizer include oligomers and polymers of butyl phthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrabydrofurfuryl olete, and acrylic acid and methacrylic acid.

In addition to the above, the following may be appropriately added to the composition, depending on the objective: an epoxy compound; a vinyl ether; a phenol compound having a hydroxymethyl group and a phenol compound having an alkoxymethyl group, described in JP-A No. 8-276558; and a cross-linkable compound having an effect of suppressing dissolution in an alkali, described in JP-A No. 11-160860, and which was previously proposed by the present inventors.

The photosensitive layer of the image recording material of the invention obtained in such a manner as described above is excellent in the film formability and film strength and exhibits high alkali-solubility at the exposed portions where exposure to IR rays has been effected.

To produce the image recording material of the invention, the respective components of the above-mentioned photosensitive layer are dissolved in a solvent and applied onto the intermediate layer formed on the anodized aluminum support, to form the photosensitive layer. Further, depending on the purposes, a protective layer, a resin intermediate layer, and a back coat layer, which will be described later, may be formed in a similar manner.

The solvent to be used here may include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethyl sulfoxide, sulfurane, γ-butyrolactone, and toluene, but the solvent is not limited to these examples. These solvents may be used alone or in form of mixture.

The concentration of the above-mentioned components (the total solid content including the additives) in the solvent is preferably 1 to 50% by weight.

In general, the coated amount (the solid content) of the photosensitive layer after being coated and dried is preferably 0.5 to 5.0 $g/m^2$ for the planographic printing plate precursor, although the amount may vary depending on the applications. The smaller the coating amount, the larger the apparent sensitivity but results in the poorer coating properties of the photosensitive film.

As the method for coating, a various kinds of methods can be employed. Examples thereof include bar coater coating, rotation coating, spray coating, curtain coating, dip coating, air knife coating, blade coating, and roll coating.

[Resin Intermediate Layer]

Whenever necessary, a resin intermediate layer may be formed between the support and the recording layer in the planographic printing plate precursor to which the photosensitive composition of the invention is applied.

This resin intermediate layer, which is made of a polymer, functions as a heat insulating layer. Thus, heat generated by exposing the precursor to an infrared laser does not diffuse into the support and is effectively used. Consequently, the planographic printing plate precursor has an advantage insofar the recording layer can attain a high degree of sensitivity. When this resin intermediate layer is formed, the recording layer is positioned so as a surface is exposed to light, or the recording layer is positioned near the surface, and the sensitivity to the infrared laser is thereby satisfactorily maintained.

In unexposed portions of the recording layer, the recording layer itself, which the alkali developer does not penetrate, functions as a protective layer for the resin intermediate layer. Accordingly, development stability of the printing plate precursor is secured to a satisfactory level and, in addition, images superior in discrimination are formed. Moreover, it is believed that over the passage of time of the images can be maintained.

On the other hand, in the exposed portions, components of the recording layer, the dissolution-suppressing function of which has been nullified, are speedily dissolved and dispersed into the developer, and, further, the resin intermediate layer, which is positioned adjacent to the support, is made mainly of an alkali-soluble resin. Accordingly, the exposed portions exhibit satisfactory solubility in the developer. Therefore, for example, even when a developer whose activity has been lowered is used, the intermediate resin layer is rapidly dissolved without leaving any portion of the layer remaining behind. This fact contributes to an improvement in the developability of the printing plate precursor, and in this way the resin intermediate layer is useful.

The resin intermediate layer is formed as a layer made mainly of alkali-soluble resin. In order to distinguish the boundary between the recording layer and the resin intermediate layer clear, it is preferable to use for the main component of the intermediate layer an alkali-soluble resin which is different from that used in the recording layer.

Preferable examples of the alkali-soluble resin used in the resin intermediate layer include alkali-soluble resins having units exhibiting high polarity, such as copolymer of N-(p-aminosulfonylphenyl) (meth)acrylamide, alkyl (meth)acrylate and acrylonitrile, copolymer of 4-maleimidebenzenesulfonamide, and styrene, and copolymer of (meth)acrylic acid, N-phenylmaleimide and (meth)acrylamide. However, the alkali-soluble resin is not limited thereto.

[Support]

As the support to be used for the image recording material of the invention, a metal plate of such as aluminum, zinc, and copper is preferable since the support is required to be plate-like material stably in the size and have sufficient heat resistance for standing the burning treatment described below. Above all, an aluminum plate which is excellent in size stability and relatively economical is particularly preferable. Further, the support of the invention is most preferably the aluminum plate subjected to anodization.

The preferable aluminum plate is a pure aluminum plate, or an alloy plate containing aluminum as a main component and trace amounts of different elements, or a plastic film on which aluminum is laminated or deposited by evaporation. The different element which may be contained in the aluminum alloy are silicon, iron, manganese, copper, magnesium, chromium, zinc, bismuth, nickel and titanium. The content of each element in the alloy is at highest 10% by weight. Particularly preferable aluminum in the invention is pure aluminum, but completely pure aluminum is difficult to produce in relation to refining technique and therefore, slight amounts of different elements may be mixed.

Accordingly, an aluminum plate to be used as a support does not need to have a specific composition, and conventionally known aluminum plates can be used. The thickness of the aluminum plate to be used in the invention is to be 0.1 mm to 0.6 mm, preferably 0.15 mm to 0.4 mm, and particularly preferably 0.2 mm to 0.3 mm.

Prior to the surface-roughening of the aluminum plate, to remove rolling oil on the surface if desired, degreasing treatment is carried out by, for example, a surfactant, an organic solvent, or an aqueous alkaline solution. The surface-roughening of the surface of the aluminum plate can be carried out by a variety of methods, for example, a method of mechanically roughening a surface, a method of electrochemically dissolving and roughening a surface, and a method of chemically selectively dissolving a surface. As the mechanical method, known methods such as a ball grounding method, a brush grounding method, a blast polishing method and a buffing method can be employed. As the electrochemical surface-roughening method, there are methods for surface roughening by using a.c. electric current or d.c. electric current in a hydrochloric acid or nitric acid electrolytic solution. Also, methods, as described in JP-A No. 54-63902, in which both methods are combined each other, can be employed.

After the aluminum plate has been surface-roughened in such a manner, the aluminum plate is subjected to alkali etching treatment and neutralization based on the necessity, anodization treatment is carried out to increase the water-retention property and the wear resistance of the surface. In the invention, it is required to use an aluminum plate subjected to the anodization treatment, which will be described later, as the support. As the electrolytes to be used for the anodization of the aluminum plate, a variety of electrolytes for forming porous oxide coating can be used and in general, sulfuric acid, phosphoric acid, oxalic acid, chromic acid and mixtures thereof can be used. The concentration of each electrolyte can properly be determined depending on the types of the electrolytes.

The treatment conditions of the anodization is not generally specified since they are changed depending on the electrolytes. However, in general, a solution with a concentration of the electrolytes in a range of 1 to 80% by weight, at a temperature of 5 to 70° C., an electric current density of 5 to 60A/dm$^2$, voltage of 1 to 100 V, and electrolysis duration in a range of 10 seconds to 5 minutes is preferable. If the amount of the anodization coating is less than 1.0 g/m$^2$, printing durability becomes insufficient or non-image forming portions are easy to be damaged, whereby ink adheres to the damaged portions at the time of printing to form so-called damage stains. After the anodization, the aluminum surface is optionally subjected to various treatment. For example, there can be employed methods for carrying out treatment with potassium fluorozirconate disclosed in Japanese Patent Application Publication (JP-B) No. 36-22063, or poly(vinyl sulfonate) disclosed in U.S. Pat. Nos. 3,276,868, 4,153,461, and 4,689,272.

The image recording material of the invention comprising the anodized aluminum support, the intermediate layer and the positive photosensitive layer, which intermediate layer and the photosensitive layer are formed successively on the anodized aluminum support, may further has an undercoat layer between the support and the intermediate layer, according to necessity.

A variety of organic compounds may be used as the components of the undercoat layer and the compounds are selected from, for example, carboxymethyl cellulose, dextrin, Gum Arabic, amino group-containing phosphonic acids such as 2-aminoethylphosphonic acid; organic phosphonic acid such as (un)substituted phenylphosphonic acid, naphthylphosphonic acid, alkylphosphonic acid, glycelophosphonic acid, methylene disphosphonic acid, and ethylene disphosphonic acid; organic phosphoric acid such as (un)substituted phenylphosphoric acid, naphthylphosphoric acid, alkylphosphoric acid, and glycelophosphoric acid; organic phosphinic acid such as (un)substituted phenylphosphinic acid, naphthylphosphinic acid, alkylphosphinic acid, and glycelophosphinic acid; aminoacids such as glycine and β-alanine; and hydroxy group-containing amine hydrochloric acid salts such as triethanolamine hydrochloric acid salt. Two or more of these compounds may be used in combination.

The organic undercoat layer may be formed by the following method. Examples of the method for forming the organic undercoat layer include a method of applying a solution obtained by dissolving the above-mentioned organic compounds in water or an organic solvent such as methanol, ethanol, or methyl ethyl ketone, or a mixture thereof to an aluminum plate and drying the solution, and a method of immersing an aluminum plate in the solution obtained by dissolving the above-mentioned organic compounds in water or an organic solvent such as methanol, ethanol, or methyl ethyl ketone, or a mixture thereof so that the support absorbs the above-mentioned compounds, and then washing with water or the like and drying the support. In the case of the former method, the solution with a concentration of the above-mentioned organic compounds in a range of 0.005 to 10% by weight can be applied by a variety of methods. In the case of the latter method, the concentration of the solution is 0.01 to 20% by weight, preferably 0.05 to 5% by weight and the immersion temperature is 20 to 90° C., preferably 25 to 50° C., and the immersion duration is 0.1 second to 20 minutes, preferably 2 seconds to 1 minute. The solution to be used for the methods may be adjusted to have pH in a range of 1 to 12 by a basic substance such as ammonia, triethylamine, and potassium hydroxide and an acidic substance such as hydrochloric acid and phosphoric acid. Further, a yellow dye may be added for tone reproducibility improvement for the image recording material.

The coating amount of the organic undercoat layer is properly 2 to 200 mg/m$^2$, preferably 5 to 100 mg/m$^2$. If the above-mentioned coating amount is less than 2 mg/m$^2$, or if the above-mentioned coating amount exceeds 200 mg/m$^2$, sufficient printing durability is not likely to be obtained.

The image recording material produced in the above-mentioned manner is preferably used as a planographic printing plate precursor. In general, a planographic printing plate precursor is subjected to image-wise exposure and development to use it as a planographic printing plate.

The light source of the light beam to be used for image-wise exposure is preferably a light source having light emitting wavelength in near IR and IR region. Solid state laser and semiconductor laser are particularly preferable.

As a developer or a replenisher for the image recording material of the invention, conventional aqueous alkaline solutions can be used.

Examples of the alkali agents include inorganic alkali agents such as sodium silicate, potassium silicate, sodium tertiary phosphate, potassium tertiary phosphate, ammonium tertiary phosphate, dibasic sodium phosphate, dibasic potassium phosphate, dibasic ammonium phosphate, sodium carbonate, potassium carbonate, ammonium carbonate, sodium hydrogen carbonate, potassium hydrogen carbonate, ammonium hydrogen carbonate, sodium borate, potassium borate, ammonium borate, sodium hydroxide, ammonium hydroxide, potassium hydroxide, and lithium hydroxide; and organic alkaline agent such as monomethylamine, dimethylamine, trimethylamine, monoethylamine, diethylamine, triethylamine, monoisoproylamine, diisopropylamine, triisopropylamine, n-butylamine, monoethanolamine, diethanolamine, triethanolamine, monoisopropanolamine, diisopropanolamine, ethylenimine, ethylenediamine, and pyridine. These alkali agents may be used alone or two or more of them in combination.

Particularly preferable developers among the alkali agents are aqueous silicate solutions such as sodium silicate and potassium silicate. The reason for that is because the developability can be adjusted depending on the ratio and the concentration of silicon oxide SiO$_2$, which is a component of the silicates, and alkali metal oxides M$_2$O, and alkalimetal silicates described in, for example JP-A No. 54-62004 and JP-B No. 57-7427 are efficiently used.

In the case of carrying out development by using an automatic developing apparatus, it is known that a large quantity of PS plates can be treated without replacing the developer in a developer tank for a long duration by adding, to the developer, aqueous solution (a replenisher) with a higher alkalinity than that of the developer. In the invention, this replenishing method is preferably employed. To promote or suppress the developability of the developer or the replenisher and improve the dispersion of development scum and affinity of the image forming portion of the printing plate to ink, a variety of surfactants and organic solvents may optionally be added.

As preferable surfactants, anionic, cationic, nonionic and amphoteric surfactants can be exemplified. Further, to the developer or the replenisher, reducing agents of such as hydroquinone, resorcin, sodium salt or potassium salt of inorganic acids such as sulfurous acid, hydrogen sulfurous acid, and further organic carboxylic acid, defoaming agents, and water hardening or softening agents may be added.

The printing plate treated by using the developer or the replenisher is washed with water and post-treated with rinsing solutions containing the surfactants or the like, and desensitizing solutions containing gum arabic and starch derivatives. The post-treatment of the image recording material of the invention can be carried out by using these treatments in combinations.

Recently, for rationalization or standardization of the printing plate production work in printing plate-producing or printing industries, automatic developing apparatuses for printing plates have been used widely. An automatic developing apparatuses generally comprise a development section and a post-treatment section. More specifically, an automatic developing apparatus includes a unit for transferring the printing plates, tanks for respective treatment solutions, and a spraying apparatuse. The automatic developing apparatus transfers the exposed printing plates horizontally and at the same time carries out development treatment by spraying the respective treatment solutions pumped up by pumps, to the printing plate, through spray nozzles. Recently, there is also known a method for carrying out treatment by transporting the printing plates by under-solution guide rolls while the printing plates are immersed in the treatment solution tanks filled with the treatment solutions. In such automatic treatment, the replenishers may be replenished to the respective treatment solutions depending on the treatment quantity, operation times, and the like. Alternatively, so-called disposable treatment method in which treatment is carried out using substantially unused treatment solutions can be employed.

In the case where the image recording material of the invention is used for a planographic printing plate precursor, the image recording material is imagewise exposed, developed, washed with water and/or rinsed and/or gum-coated to obtain a planographic printing plate. If unnecessary image portions (e.g. film edge trace of a master film) are present in the planographic printing plate, the unnecessary image portions are erased. Such erasing is preferably carried out by a method of applying an erasing solution as described in JP-B No. 2-13293 to the unnecessary image portions and washing with water after a prescribed duration. A method of radiating active light beam led through optical fibers to the unnecessary image portions and then carrying out development may also be employed.

The planographic printing plate produced in such a manner is coated with a desensitizing gum if necessary and supplied to printing steps. In a case where a planographic printing plate with further improved printing durability is to be obtained, burning treatment is optionally carried out.

In the case where the burning treatment of the planographic printing plate is carried out, it is preferable to treat, prior to the burning treatment, the planographic printing plate with surface conditioning solutions described in JP-B Nos. 61-2518 and 55-28062 and JP-A Nos. 62-31859 and 61-159655.

Examples of a method for effecting such a pre-burning treatment include a method of applying the surface conditioning solutions to the planographic printing plate by sponge or degreased cotton doped with the solutions, a method of immersing the printing plate in a vat filled with the surface conditioning solutions, a method of applying the surface conditioning solutions using automatic coaters. In a case where after application the amount of solution applied is made uniform with a squeegee or a squeegee roller, a better result can be obtained.

In general, the amount of surface-adjusting solution applied is suitably from 0.03 to 0.8 g/m$^2$ (dry mass). If necessary the planographic printing plate onto which the surface-adjusting solution is applied can be dried, and then the plate is heated to a high temperature by means of a burning processor (for example, a burning processor (BP-1300) sold by Fuji Photo Film Co., Ltd.) or the like. In this case, the heating temperature and the heating time, which depend on the kind of components forming the image, are preferably from 150 to 300° C. and from 0.5 to 20 minutes, respectively.

In the case of using the planographic printing plate precursor of the invention, burning treatment in a temperature condition of 150 to 300° C., preferably 180 to 300° C., can improve the strength of the image portions and the adhesion strength between the photosensitive layer and the support through the intermediate layer, so that a planographic printing plate with excellent burning printing durability can be obtained.

If necessary, a planographic printing plate subjected to burning treatment can be subjected to treatments which have been conventionally conducted, such as a water-washing treatment and gum coating. However, in a case where a surface-adjusting solution containing a water soluble polymer compound or the like is used, the so-called desensitizing treatment (for example, gum coating) can be omitted. The planographic printing plate obtained as a result of such treatments is applied to an offset printing machine or to some other printing machine, and is used for printing on a great number of sheets.

EXAMPLES

Hereinafter, the present invention will be described in detail by way of examples. However, the invention is not limited to these examples.

[Production of Support]

Supports 1 to 3 were produced from 0.3 mm-thick JIS-A-1050 aluminum plates by the following treatment.

(a) Mechanical Surface-Roughening Treatment

Mechanical surface roughening treatment was carried out by a rotating roller type nylon brush by supplying a suspension of an abrasive agent (silica sand) having a specific gravity of 1.12 and water as an abrasive slurry solution to the surface of the aluminum plate. The average particle size of the abrasive agent was 8 µm and the maximum particle size was 50 µm. The material of the nylon brush was 6.10 nylon with a hair length of 50 mm and a hair diameter of 0.3 mm. The nylon brush was produced by implanting hairs densely in holes formed in a stainless cylinder having a diameter of 300 mm. Three rotary brushes were employed. The distance between two supporting rollers (diameter: 200 mm) under the brush was 300 mm. The brush roller was pressed to the aluminum plate until the load was increased to a load higher by 7 kW than that before it was pressed to the aluminum plate. The rotation direction of the brush was the same as the direction of the movement of the aluminum plate. The rotation speed of the brush was 200 rpm.

(b) Alkali Etching Treatment

The obtained aluminum plate was etched by spraying an aqueous NaOH solution (concentration: 26% by weight, aluminum ion concentration of 6.5% by weight) at 70° C. to etch 6 g/m² of the aluminum plate, followed by washing with water by spraying.

(c) Desmutting Treatment

Desmutting treatment was carried out by spraying an aqueous 1% by weight nitric acid solution (containing 0.5% by weight of aluminum ion) at 30° C., followed by washing with water by spraying. As the aqueous nitric acid solution, a waste solution obtained from the step of electrochemical surface roughening treatment by applying a.c. current in an aqueous nitric acid solution was used.

(d) Electrochemical Surface Roughening Treatment

Electrochemical surface roughening treatment was carried out continuously using an a.c. voltage of 60 Hz. The electrolytic solution was an aqueous solution containing 10.5 g/L of nitric acid (including 5 g/L of aluminum ions) at 50° C. The a.c. power source had the waveform in which the time TP required for current value to reach a peak from 0 was 0.8 msec and the duty ratio was 1:1, and trapezoidal rectangular wave a.c. current was used to carry out electrochemical surface roughening treatment using a carbon electrode as a counter electrode. Ferrite was used as an auxiliary anode. The electrolytic bath employed was a radial cell type.

The current density was 30 A/dm² as a peak current, and the quantity of electricity was 220 C/dm² as the total quantity of electricity when the aluminum plate was an anode. 5% of the current flowing from the power source was branched to the auxiliary electrode. Thereafter, the aluminum plate was washed with water by spraying.

(e) Alkali Etching Treatment

Etching treatment was carried out by spraying a solution containing 26% by weight of caustic soda and 6.5% by weight of aluminum ions to the aluminum plate at 32° C. to etch 0.20 g/cm² of the aluminum plate to remove the smut component primarily containing aluminum hydroxide generated when performing the foregoing electrochemical surface roughening treatment using a.c. current, and also to etch the edge part of the pits produced to thereby round the edge part. Thereafter, the aluminum plate was washed with water by spraying.

(f) Desmutting Treatment

Desmutting treatment was carried out by spraying an aqueous 15% by weight nitric acid solution (including 4.5% by weight of aluminum ions) at 30° C., followed by washing with water by spraying. As the aqueous nitric acid solution used in the desmutting treatment, a waste solution obtained in the step of electrochemical surface roughening treatment by applying a.c. current in an aqueous nitric acid solution was used.

(g) Electrochemical Surface Roughening Treatment

Electrochemical surface roughening treatment was continuously carried out by applying an a.c. voltage of 60 Hz. In this case, the electrolytic solution was an aqueous solution containing 7.5 g/L of hydrochloric acid (including 5 g/L of aluminum ions) at 35° C. The a.c. power source had a trapezoidal rectangular waveform and a carbon electrode was used as a counter electrode to carry out electrochemical surface roughening treatment. Ferrite was used as an auxiliary anode. The electrolytic bath employed was a radial cell type.

The current density was 25 A/dm² as a peak current and the quantity of electricity was 50 C/dm² as the total quantity of electricity when the aluminum plate was an anode.

Thereafter, the aluminum plate was washed with water by spraying.

(h) Alkali Etching Treatment

Etching treatment was carried out by spraying a solution containing 26% by weight of caustic soda and 6.5% by weight of aluminum ions to the aluminum plate at 32° C. to etch 0.10 g/cm² of the aluminum plate to remove the smut component primarily containing aluminum hydroxide generated when performing the foregoing electrochemical surface roughening treatment using a.c. current, and also to etch the edge part of the pits produced to thereby round the edge part. Thereafter, the aluminum plate was washed with water by spraying.

(i) Desmutting Treatment

Desmutting treatment was carried out by spraying an aqueous solution containing 25% by weight sulfuric acid solution (including 0.5% by weight of aluminum ions) at 60° C., followed by washing with water by spraying.

(j) Anodization Treatment

Sulfuric acid was used as the electrolytic solution. The electrolytic solution contained 170 g/L of sulfuric acid (including 0.5% by weight of aluminum ions) at 43° C. Thereafter, the aluminum plate was washed with water by spraying.

The current densities were respectively about 30 A/dm². The final anodized coating amount was 2.7 g/m².

(k) Alkali Metal Silicate Treatment

Alkali metal silicate treatment (silicate treatment) was carried out by immersing the above-mentioned aluminum support in an aqueous solution containing 1% by weight of No. 3 sodium silicate at 30° C. for 10 seconds, followed by washing with water by spraying. The amount of silicate adhering to the support was 3.5 mg/m².

<Support 1>

A support 1 was produced by successively carrying out the above-mentioned respective steps (a) to (j) so as to adjust the etching amount to 3.5 g/m².

<Support 2>

A support 2 was produced in the same manner except that steps (g), (h), and (i) were omitted.

<Support 3>

A support 3 was produced by successively carrying out the above-mentioned respective steps (a) to (k) so as to adjust the etching amount in step (e) to 3.5 g/m².

(Formation of Intermediate Layer)

The following coating solution for intermediate layer formation was applied to the respective supports produced as described above and then dried at 80° C. for 15 seconds to form intermediate layers. The supports, the intermediate layer polymers, and the intermediate layer coating amounts (mg/m²) after drying are shown in Table 1. The polymers of the intermediate layers shown in Table 1 were polymers described in specific examples (P-1 to P-13) of the above-mentioned specific polymers.

<Coating Solution for Intermediate Layer Formation>

| Interlayer polymer (compounds described in Table 1) | amounts shown in Table 1 |
|---|---|
| Methanol | 100 g |
| Water | 1 g |

Examples 1 to 8

The following photosensitive layer coating solution 1 was applied to the supports having the intermediate layers formed in the above-mentioned manner so as to adjust the coating amount to 1.4 g/m². Then, the coating solution was dried at 140° C. for 100 seconds in PERFECT OVEN PH 200 manufactured by Tabai Co., with its Wind Control being set to 7, to obtain planographic printing plate precursors of the Examples and Comparative Examples.

| <Photosensitive layer coating solution 1> | |
|---|---|
| Novolak resin (m/p-cresol (6/4), weight average molecular weight 7,000, un-reacted cresol 0.5% by weight) | 0.9 g |
| Ethyl methacrylate/isobutyl methacrylate/methacrylic acid copolymer (35/35/30% by mole) | 0.10 g |
| Photothermal conversion agent with the following structure (Cyanine dye A) | 0.10 g |
| Phthalic anhydride | 0.05 g |
| p-Toluenesulfonic acid | 0.002 g |
| Compound obtained by replacing the coupling ion of Ethyl violet with 6,6-hdyoxy-β-naphthalenesulfonic acid | 0.02 g |
| Fluorine-based polymer (DEFENSA F-780 F (solid content 30%), manufactured by Dainippon Ink and Chemicals, Inc.) | 0.015 g |
| Fluoro type polymer (DEFENSA F-781 F (solid content 100%), manufactured by Dainippon Ink and Chemicals, Inc.) | 0.035 g |
| Methyl ethyl ketone | 12 g |

Cyanine Dye A

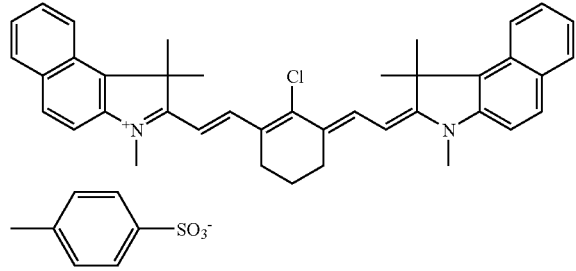

Comparative Example 1

The image recording material of Comparative Example 1 having a photosensitive layer was formed in the same manner as in Example 1, except that no intermediate layer was formed on the aluminum plate (support 1) anodized in the same manner as in Example 1.

Comparative Example 2

The image recording material of Comparative Example 2 having an intermediate layer was formed in the same manner as in Example 1, except that a photosensitive layer was formed from the following photosensitive layer coating solution 2 and that a support 3 subjected to hydrophilization by a silicate after anodization was used in place of the support 1 used in Example 1.

<Photosensitive Layer Coating Solution 2>

| Specific copolymer 1 (copolymer obtained in Synthesis Example 1 disclosed in JP-A No. 11-44956) | 0.75 g |
|---|---|
| m, p-Cresol Novolak resin (m, p ratio = 6/4, weight average molecular weight 3,500, unreacted cresol 0.5% by weight) | 0.25 g |
| p-Toluenesulfonic acid | 0.003 g |
| Tetrahydrophthalic anhydride | 0.03 g |
| Cyanine Dye A (the above-mentioned structure) | 0.017 g |
| Dye obtained by replacing the coupling ion of Victoria Pure Blue BOH with 1-naphthalenesulfonic acid anion | 0.015 g |
| Fluoro type surfactant (MEGAFAC F-177, manufactured by Dainippon Ink and Chemicals, Inc.) | 0.05 g |
| γ-Butyrolactone | 10 g |
| Methyl ethyl ketone | 10 g |
| 1-Methoxy-2-propanol | 1 g |

[Evaluation of Image Recording Materials]

(Exposure, Development)

The above obtained respective image recording materials of the Examples and Comparative Examples were image-wise exposed at 10 W/250 rpm by using TREND SETTER 800 Quantum manufactured by Creo Co. Then, the images were developed by an automatic developing apparatus LP-940H comprising a development bath filled with a developer for PS, LH-DS, manufactured by Fuji Photo Film Co., Ltd. and charged under standard conditions and three baths filled with FP-2W (1:1), to obtain planographic printing plates.

(Evaluation of Chemical Resistance)

A droplet of ABC blanket cleaner manufactured by Allied Co. was dropped by a dropper to the obtained respective planographic printing plates of the Examples and Comparative Examples and left to stand for 5 minutes. Thereafter, the planographic printing plates were washed with water. The degree of damage done to the photosensitive layers in the region where the droplet was dropped were visually observed and evaluated according to the following criteria.

A: The dropping region cannot be clearly observed.
B: The dropping region can be observed vaguely (i.e., the region has been slightly thinned)
C: The dropping region has been thinned
D: the photosensitive layer in the dropping region was completely dissolved.

(Evaluation of Printing Durability)

The obtained planographic printing plates were used to carry out printing by black ink, DIC-GEOS(N) manufactured by Dainippon Ink and Chemicals, Inc. using a LITHRONE printing apparatus manufactured by Komori Corp. The printing durability was evaluated, based on the number of printed sheets at the point where it could be observed visually that the density of the mat image had started to become lighter. Evaluation was made such that, the larger the number of printed sheets, the better the printing durability.

(Evaluation of Printing Durability After Burning Treatment)

After washing with water the printing surfaces of the planographic printing plates obtained by development in the same manner as those in the above-mentioned printing durability evaluation, the printing surfaces were wiped with a burning surface conditioning solution BC-7 manufactured by Fuji Photo Film Co., Ltd. and then subjected to burning treatment at about 270° C. for 2 minutes. Thereafter, the planographic printing plates were washed with water, and the printing surfaces were treated with a solution of Gum FP-2W manufactured by Fuji Photo Film Co., Ltd. diluted by two times by volume with water.

Then, in the same manner as in the above-mentioned printing durability evaluation, the planographic printing plates were used to carry out printing by black ink, DIC-GEOS(N) manufactured by Dainippon Ink and Chemicals, Inc. using a LITHRONE printing apparatus manufactured by Komori Corp. The printing durability after burning treatment was evaluated, based on the number of printed sheets at the point where it could be observed visually that the density of the mat image had started to become lighter. Evaluation was made such that, the larger the number of printed sheets, the better the printing durability.

The above-described respective evaluation results are shown in Table 1.

Reference Examples 1 and 2

The image recording materials of Reference Examples 1 and 2 were obtained by forming intermediate layers and photosensitive layers in the same manner as in Example 1 and Example 6, respectively, except that support 3 subjected to hydrophilization (silicate treatment) by alkali metal silicate after anodization was used in place of the support 1 used in Example 1. The results were evaluated in the same manner as in Example 1 and are also shown in Table 1. As is clear from Table 1, in the case where supports which were not treated with silicate after anodization were used, the effect of improved chemical resistance was found to be higher than that in the case of using supports subjected to the silicate treatment. Accordingly, it is evident that an image recording material of the invention has remarkably excellent effects when an aluminum plate anodized but not treated with silicate is used as a support.

What is claimed is:

1. An image recording material comprising:
   an anodized aluminum support which is not subjected to a silicate treatment;
   an intermediate layer containing a polymer having a carboxylic acid group at a distal end of a side chain thereof that is formed by polymerizing a monomer having a structure defined by either of the following formulae, the intermediate layer being formed on the aluminum support; and
   a photosensitive layer containing at least 50% by weight or more of novolak type phenol resin and a photothermal conversion agent and recordable by IR laser beam,

TABLE 1

|  | Support | Polymer | Intermediate layer Addition amount in the coating solution (g) | Coating amount (mg/m$^2$) | Chemical resistance | Printing durability (10,000 sheets) Without burning treatment | Burning treatment |
|---|---|---|---|---|---|---|---|
| Example 1 | 1 | P-1 | 0.30 | 15 | B | 5.0 | 15 |
| Example 2 | 1 | P-2 | 0.50 | 25 | A | 4.8 | 16 |
| Example 3 | 1 | P-3 | 0.20 | 10 | B | 5.3 | 15 |
| Example 4 | 1 | P-8 | 0.30 | 15 | A | 5.0 | 15 |
| Example 5 | 1 | P-9 | 0.45 | 22 | A | 5.0 | 14 |
| Example 6 | 1 | P-11 | 0.30 | 15 | A | 5.0 | 15 |
| Example 7 | 2 | P-1 | 0.30 | 15 | B | 5.3 | 15 |
| Example 8 | 2 | P-11 | 0.30 | 15 | A | 5.0 | 15 |
| Reference Example 1 | 3 | P-1 | 0.30 | 15 | C | 4.5 | 14 |
| Reference Example 2 | 3 | P-11 | 0.30 | 15 | C | 4.5 | 14 |
| Comparative Example 1 | 1 |  | — |  | D | 4.8 | 14 |
| Comparative Example 2 | 3 | P-1 | 0.30 | 15 | A | 5.0 | 5.2 |

According to the results in Table 1, the planographic printing plates of Examples 1 to 8 obtained by exposing and developing the image recording materials of the invention comprising the specific intermediate layers on the anodized aluminum supports were found to be excellent in both of chemical resistance and printing durability. It was also confirmed that printing durability can be improved further by the burning treatment. The planographic printing plate of Comparative Example 1 having no intermediate layer was found to be inferior in chemical resistance. With respect to the planographic printing plate of Comparative Example 2 having a photosensitive layer with less content of Novolak resin, although it was observed that the intermediate layer had an effect of improving the chemical resistance, the burning treatment was found to have no effect of improving the printing durability.

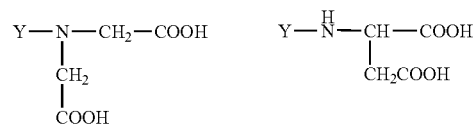

wherein in the formulae, Y represents a linking group to the polymer main chain skeleton.

2. An image recording material according to claim 1, wherein the support and the photosensitive layer firmly adhere to each other by way of the intermediate layer, due to interaction between the carboxylic acid group of the distal end of the side chain of the polymer and the anodized film of the surface of the support.

3. An image recording material according to claim 1, wherein the intermediate layer has excellent solubility toward an alkaline developer.

4. An image recording material according to claim 1, wherein the polymer comprises a monomer having an onium group as a copolymerization component.

5. An image recording material according to claim 1, wherein the polymer comprises a monomer having a lactone group as a copolymerization component.

6. An image recording material according to claim 1, wherein the polymer comprises a polycarboxylic acid group in the side chain thereof.

7. An image recording material according to claim 1, wherein the polymer comprises, as a polymerization component, a monomer having a carboxylic acid group at the side chain thereof and the content of the monomer is 5% by mole or more.

8. An image recording material according to claim 1, wherein the polymer has a weight average molecular weight of 500 to 1,000,000.

9. An image recording material according to claim 1, wherein the polymer has a weight average molecular weight of 1000 to 500,000.

10. An image recording material comprising an anodized aluminum support which is not subjected to a silicate treatment and at least an intermediate layer and a photosensitive layer formed on the support,
wherein the intermediate layer contains a polymer having a carboxylic acid group at a distal end of a side chain thereof that is formed by polymerizing a monomer having a structure defined by either of the following formulae,
the polymer comprises, as a polymerization component, at least one of a monomer having an onium group and a monomer having a lactone group, and
the photosensitive layer contains 50% by weight or more of novolak type phenol resin and is recordable by IR laser beam,

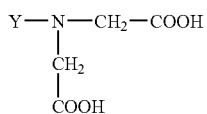 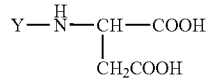

wherein in the formulae, Y represents a linking group to the polymer main chain skeleton.

11. An image recording material according to claim 10, wherein the intermediate layer firmly adheres to the support, due to interaction between the carboxylic add group of the distal end of the side chain of the polymer and the anodized film of the surface of the aluminum support.

12. An image recording material according to claim 10, wherein the intermediate layer firmly adheres to the support, due to at least one of the monomer having the onium group and the monomer having the lactone group interacting with the anodized film of the surface of the aluminum support.

13. An image recording material according to claim 10, wherein the photosensitive layer firmly adheres to the intermediate layer, due to at least one of the monomer having the onium group and the monomer having the lactone group interacting with the photosensitive layer.

14. An image recording material according to claim 10, wherein the intermediate layer has excellent solubility toward an alkaline developer.

15. A planographic printing plate, obtained by:
preparing an image recording material comprising an anodized aluminum support which is not subjected to a silicate treatment, and at least an intermediate layer and a photosensitive layer formed on the aluminum support;
subjecting the image recording material to IR laser exposure treatment and to development treatment and;
heating the image recording material at 150 to 300° C.,
wherein the intermediate layer contains a polymer having a carboxylic add group at a distal end of a side chain thereof that is formed by polymerizing a monomer having a structure defined by either of the following formulae, and the photosensitive layer contains at least 50% by weight or more of novolak type phenol resin and a photothermal conversion agent and is recordable by IR laser beam,

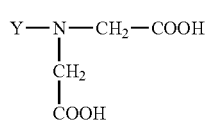 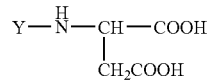

wherein in the formulae, Y represents a linking group to the polymer main chain skeleton.

16. A planographic printing plate, obtained by:
preparing an image recording material comprising an anodized aluminum support which is not subjected to a silicate treatment, and at least an intermediate layer and a photosensitive layer formed on the aluminum support;
subjecting the image recording material to IR laser exposure treatment and to development treatment and;
heating the image recording material at 150 to 300° C.,
wherein the intermediate layer contains a polymer having a carboxylic acid group at a distal end of a side chain thereof that is formed by polymerizing a monomer having a structure defined by either of the following formulae, the polymer comprising as a polymerization component at least one of a monomer having an onium group and a monomer having a lactone group, the photosensitive layer contains at least 50% by weight or more of novolak type phenol resin and is recordable by IR laser beam,

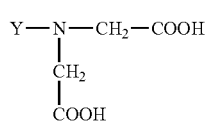 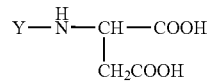

wherein in the formulae, Y represents a linking group to the polymer main chain skeleton.

* * * * *